US012601778B2

(12) United States Patent
Ma et al.

(10) Patent No.: US 12,601,778 B2
(45) Date of Patent: Apr. 14, 2026

(54) FIELD-BIASED NONLINEAR OPTICAL METROLOGY USING CORONA DISCHARGE SOURCE

(71) Applicants: SK hynix Inc., Icheon-si (KR); FemtoMetrix, Inc., Irvine, CA (US)

(72) Inventors: Seongmin Ma, Icheon-si (KR); Sangmin Kim, Icheon-si (KR); Jonghoi Cho, Icheon-si (KR); Ming Lei, Seattle, WA (US)

(73) Assignees: SK HYNIX INC., Icheon-si (KR); FEMTOMETRIX, INC., Los Angeles, CA (US)

(*) Notice: Subject to any disclaimer, the term of this patent is extended or adjusted under 35 U.S.C. 154(b) by 0 days.

(21) Appl. No.: 16/396,227

(22) Filed: Apr. 26, 2019

(65) Prior Publication Data

US 2020/0057104 A1 Feb. 20, 2020

Related U.S. Application Data

(60) Provisional application No. 62/663,925, filed on Apr. 27, 2018.

(51) Int. Cl.
*G01R 31/265* (2006.01)
*G01N 21/17* (2006.01)
(Continued)

(52) U.S. Cl.
CPC ....... *G01R 31/2656* (2013.01); *G01N 21/636* (2013.01); *G01N 21/9501* (2013.01);
(Continued)

(58) Field of Classification Search
CPC . G01B 5/00; G01B 7/00; G01B 21/00; G01D 3/00; G01D 5/00; G01K 1/00;
(Continued)

(56) References Cited

U.S. PATENT DOCUMENTS 3,218,498 A 11/1965 Schroeder et al.
3,850,508 A 11/1974 Sittig et al.
(Continued)

FOREIGN PATENT DOCUMENTS

CA 2030878 5/1991
CN 1864066 11/2006
(Continued)

OTHER PUBLICATIONS

US 11,092,637 B2, 08/2021, Koldiaev et al. (withdrawn)
(Continued)

*Primary Examiner* — Eman A Alkafawi
*Assistant Examiner* — Joseph O Nyamogo
(74) *Attorney, Agent, or Firm* — KNOBBE, MARTENS, OLSON & BEAR, LLP

(57) ABSTRACT

Various approaches can be used to interrogate a surface such as a surface of a layered semiconductor structure on a semiconductor wafer. Certain approaches employ Second Harmonic Generation while other utilize four wave-mixing or multi-wave mixing. Corona discharge may be applied to the sample to provide additional information. Some approaches involve determining current flow from a sample illuminated with radiation.

22 Claims, 13 Drawing Sheets

(51) Int. Cl.

| | |
|---|---|
| *G01N 21/63* | (2006.01) |
| *G01N 21/67* | (2006.01) |
| *G01N 21/84* | (2006.01) |
| *G01N 21/95* | (2006.01) |
| *G01R 29/24* | (2006.01) |
| *G01R 31/26* | (2020.01) |
| *G01R 31/28* | (2006.01) |
| *G01R 31/308* | (2006.01) |
| *H01L 21/66* | (2006.01) |

(52) U.S. Cl.
CPC ......... *G01R 29/24* (2013.01); *G01R 31/2601*
(2013.01); *G01R 31/2831* (2013.01); *G01R
31/308* (2013.01); *H01L 22/12* (2013.01);
*H01L 22/20* (2013.01); *H01L 22/30* (2013.01);
*G01N 2021/1719* (2013.01); *G01N 2021/1721*
(2013.01); *G01N 21/67* (2013.01); *G01N
2021/8438* (2013.01)

(58) Field of Classification Search
CPC .... G01K 3/00; G01L 1/00; G01L 5/00; G01L
9/00; G01M 3/00; G01M 13/00; G01M
15/00; G01N 3/00; G01N 17/00; G01N
21/00; G01N 27/00; G01N 33/00; G01N
2021/00; G01N 21/636; G01N 21/9505;
G01N 21/9501; G01N 21/67; G01N
2021/8438; G01N 2021/1719; G01N
2021/1721; G01Q 60/00; G01R 1/00;
G01R 3/00; G01R 15/00; G01R 19/00;
G01R 22/00; G01R 27/00; G01R 29/00;
G01R 31/00; G01R 33/00; G01R 35/00;
G01R 31/2656; G01R 29/24; G01R
31/2601; G01R 31/2831; G01R 31/308;
G02F 1/00; G02F 2/00; G02F 2001/00;
G02F 2201/00; G02F 2202/00; G02F
2203/00; G03G 15/00; G03H 1/00; G03H
2001/00; G03H 2226/00; G06F 17/00;
G07C 9/00; H01F 17/00; H01F 27/00;
H01F 2017/00; H01F 2021/00; H01H
1/00; H01H 2001/00; H01H 2009/00;
H01L 22/00; H01L 23/00; H01L 24/00;
H01L 25/00; H01L 27/00; H01L 29/00;
H01L 2223/00; H01L 2224/00; H01L
2924/00; H01L 22/12; H01L 22/20; H01L
22/30; H01R 9/00; H01R 12/00; H02M
1/00; H02M 3/00; H02M 7/00; H02M
2001/00; H02M 2003/00; H02P 5/00;
H03B 5/00; H03D 3/00; H03D 7/00;
H03F 1/00; H03F 3/00; H03F 2200/00;
H03F 2203/00; H03G 1/00; H03G 3/00;
H03H 7/00; H03H 11/00; H03H 19/00;
H03J 1/00; H03J 3/00; H03J 2200/00;
H03K 17/00; H03L 7/00; H03L 2207/00;
H04B 17/00; H04L 27/00; H04R 3/00;
H04R 29/00; H04W 24/00; H05K 1/00;
H05K 3/00; H05K 7/00
See application file for complete search history.

(56) References Cited

U.S. PATENT DOCUMENTS

| | | | |
|---|---|---|---|
| 4,286,215 A | 8/1981 | Miller | |
| 4,291,961 A | 9/1981 | Takayama | |
| 4,584,531 A | 4/1986 | Couch | |
| 4,652,757 A | 3/1987 | Carver | |
| 4,812,756 A * | 3/1989 | Curtis | G01R 15/165 250/492.2 |

| | | | |
|---|---|---|---|
| 5,294,289 A | 3/1994 | Heinz et al. | |
| 5,557,409 A | 9/1996 | Downer et al. | |
| 5,748,317 A | 5/1998 | Maris et al. | |
| 5,767,693 A | 6/1998 | Verkuil | |
| 5,814,820 A | 9/1998 | Dong et al. | |
| 5,844,684 A | 12/1998 | Maris et al. | |
| 6,011,404 A | 1/2000 | Ma et al. | |
| 6,147,799 A | 11/2000 | MacDonald | |
| 6,191,605 B1 | 2/2001 | Miller et al. | |
| 6,321,601 B1 | 11/2001 | Maris | |
| 6,356,377 B1 | 3/2002 | Bishop et al. | |
| 6,426,502 B1 | 7/2002 | Finarov | |
| 6,650,800 B2 | 11/2003 | Litvin | |
| 6,751,374 B2 | 6/2004 | Wu et al. | |
| 6,771,092 B1 | 8/2004 | Fung et al. | |
| 6,781,686 B2 | 8/2004 | Hunt | |
| 6,788,405 B2 | 9/2004 | Hunt | |
| 6,791,099 B2 | 9/2004 | Some et al. | |
| 6,795,175 B2 | 9/2004 | Hunt | |
| 6,803,777 B2 | 10/2004 | Pfaff et al. | |
| 6,819,844 B2 | 11/2004 | Hunt | |
| 6,856,159 B1 | 2/2005 | Tolk et al. | |
| 6,858,859 B2 | 2/2005 | Kusunose | |
| 6,882,414 B2 | 4/2005 | Hunt | |
| 6,898,359 B2 | 5/2005 | Soljacic et al. | |
| 6,900,894 B2 | 5/2005 | McMillen et al. | |
| 7,064,565 B1 | 6/2006 | Xu et al. | |
| 7,158,284 B2 | 1/2007 | Alles et al. | |
| 7,202,691 B2 | 4/2007 | Lagowski et al. | |
| 7,230,443 B1 | 6/2007 | Fung et al. | |
| 7,248,062 B1 * | 7/2007 | Samsavar | G01R 31/303 257/E21.531 |
| 7,259,868 B2 | 8/2007 | Ozcan et al. | |
| 7,304,305 B2 | 12/2007 | Hunt | |
| 7,324,267 B2 | 1/2008 | Melloni et al. | |
| 7,333,192 B2 | 2/2008 | Nakano et al. | |
| 7,355,618 B2 | 4/2008 | Seto et al. | |
| 7,362,496 B2 | 4/2008 | Boretz et al. | |
| 7,433,056 B1 | 10/2008 | Janik | |
| 7,580,138 B2 | 8/2009 | Price | |
| 7,592,828 B2 | 9/2009 | Song | |
| 7,595,204 B2 | 9/2009 | Price | |
| 7,616,307 B2 | 11/2009 | Murtagh et al. | |
| 7,659,979 B2 | 2/2010 | Murtagh et al. | |
| 7,684,047 B2 | 3/2010 | Drake et al. | |
| 7,718,969 B2 | 5/2010 | Zhang et al. | |
| 7,781,739 B1 | 8/2010 | Jannson et al. | |
| 7,830,527 B2 | 11/2010 | Chen | |
| 7,893,703 B2 | 2/2011 | Rzepiela et al. | |
| 7,894,126 B2 | 2/2011 | Gunter et al. | |
| 7,982,944 B2 | 7/2011 | Kippenberg et al. | |
| 8,009,279 B2 | 8/2011 | Hempstead | |
| 8,049,304 B2 | 11/2011 | Srividya et al. | |
| 8,143,660 B2 | 3/2012 | Lee et al. | |
| 8,215,175 B2 | 7/2012 | Goto et al. | |
| 8,264,693 B2 | 9/2012 | Stoica et al. | |
| 8,525,287 B2 | 9/2013 | Tian et al. | |
| 8,573,785 B2 | 11/2013 | Kuksenkov et al. | |
| 8,693,301 B2 | 4/2014 | Knittel et al. | |
| 8,755,044 B2 | 6/2014 | Reich et al. | |
| 9,018,968 B2 | 4/2015 | Huang et al. | |
| 9,109,498 B2 | 8/2015 | Bradley et al. | |
| 9,194,908 B2 | 11/2015 | Heidmann | |
| 9,285,338 B2 | 3/2016 | Dickerson et al. | |
| 9,554,738 B1 | 1/2017 | Gulati et al. | |
| 9,652,729 B2 | 5/2017 | Hoffman, Jr. et al. | |
| 9,759,656 B2 | 9/2017 | Ito et al. | |
| 9,778,177 B2 | 10/2017 | Roke et al. | |
| 10,274,310 B2 | 4/2019 | Hunt et al. | |
| 10,371,668 B2 | 8/2019 | Garnett et al. | |
| 10,551,325 B2 | 2/2020 | Koldiaev et al. | |
| 10,591,525 B2 * | 3/2020 | Koldiaev | G01R 31/2601 |
| 10,591,526 B1 | 3/2020 | Chowdhury et al. | |
| 10,613,131 B2 | 4/2020 | Koldiaev et al. | |
| 10,663,504 B2 | 5/2020 | Koldiaev et al. | |
| 10,942,116 B2 | 3/2021 | Prater et al. | |
| 10,989,664 B2 | 4/2021 | Adell et al. | |
| 11,002,665 B2 | 5/2021 | Prater et al. | |
| 11,150,287 B2 | 10/2021 | Koldiaev et al. | |

(56) References Cited

U.S. PATENT DOCUMENTS

| | | |
|---|---|---|
| 11,199,507 B2 | 12/2021 | Koldiaev et al. |
| 11,293,965 B2 | 4/2022 | Koldiaev et al. |
| 11,415,617 B2 | 8/2022 | Koldiaev et al. |
| 11,473,903 B2 | 10/2022 | Hunt et al. |
| 11,808,706 B2 | 11/2023 | Adell et al. |
| 11,821,911 B2 | 11/2023 | Koldiaev et al. |
| 11,946,863 B2 | 4/2024 | Lei |
| 11,988,611 B2 | 5/2024 | Koldiaev et al. |
| 12,158,492 B2 | 12/2024 | Lei |
| 12,241,924 B2 | 3/2025 | Koldiaev et al. |
| 2002/0132378 A1 | 9/2002 | Abadeer et al. |
| 2003/0057972 A1* | 3/2003 | Pfaff .................... G01R 31/311 |
| | | 324/754.23 |
| 2003/0148391 A1 | 8/2003 | Salafsky |
| 2004/0046539 A1 | 3/2004 | Rhoads |
| 2005/0051722 A1 | 3/2005 | Makino et al. |
| 2005/0058165 A1 | 3/2005 | Morehead et al. |
| 2005/0083633 A1 | 4/2005 | Riebel et al. |
| 2006/0267622 A1* | 11/2006 | Lagowski ............ G01R 31/312 |
| | | 324/754.21 |
| 2010/0188094 A1 | 7/2010 | Allibert et al. |
| 2010/0208757 A1 | 8/2010 | Hu |
| 2010/0272134 A1 | 10/2010 | Blanding et al. |
| 2011/0031392 A1 | 2/2011 | McEwen et al. |
| 2011/0125458 A1 | 5/2011 | Xu et al. |
| 2012/0002696 A1* | 1/2012 | Oki .......................... H01S 5/50 |
| | | 372/50.22 |
| 2012/0019816 A1 | 1/2012 | Shibata |
| 2013/0003070 A1 | 1/2013 | Sezaki et al. |
| 2013/0306866 A1 | 11/2013 | Hoque et al. |
| 2015/0002651 A1 | 1/2015 | Shimizu et al. |
| 2015/0014528 A1 | 1/2015 | Lechner |
| 2015/0122993 A1 | 5/2015 | Noji et al. |
| 2015/0330908 A1 | 11/2015 | Koldiaev et al. |
| 2015/0330909 A1 | 11/2015 | Koldiaev et al. |
| 2015/0331029 A1 | 11/2015 | Koldiaev et al. |
| 2015/0331036 A1 | 11/2015 | Koldiaev et al. |
| 2016/0238532 A1 | 8/2016 | Freudiger et al. |
| 2017/0067830 A1 | 3/2017 | Adell et al. |
| 2017/0338781 A1 | 11/2017 | Lyalin et al. |
| 2018/0033704 A1* | 2/2018 | Suzuki .................... H01L 22/26 |
| 2018/0038797 A1 | 2/2018 | Eriguchi et al. |
| 2018/0210026 A1* | 7/2018 | Nikic ..................... G01N 27/61 |
| 2018/0292441 A1 | 10/2018 | Koldiaev et al. |
| 2019/0120753 A1 | 4/2019 | Prater et al. |
| 2019/0287760 A1 | 9/2019 | He et al. |
| 2020/0025677 A1 | 1/2020 | Prater et al. |
| 2020/0027693 A1 | 1/2020 | Fang et al. |
| 2020/0088784 A1 | 3/2020 | Lei |
| 2020/0110029 A1 | 4/2020 | Lei |
| 2020/0348348 A1 | 11/2020 | Koldiaev et al. |
| 2020/0400732 A1 | 12/2020 | Koldiaev et al. |
| 2020/0408699 A1 | 12/2020 | Koldiaev et al. |
| 2021/0055338 A1 | 2/2021 | Koldiaev et al. |
| 2022/0003678 A1 | 1/2022 | Adell et al. |
| 2022/0260626 A1 | 8/2022 | Koldiaev et al. |
| 2022/0317060 A1 | 10/2022 | Koldiaev et al. |
| 2022/0364850 A1 | 11/2022 | Adler |
| 2022/0413029 A1 | 12/2022 | Koldiaev et al. |
| 2024/0071710 A1 | 2/2024 | Wong |
| 2024/0077302 A1 | 3/2024 | Adler |
| 2024/0085324 A1 | 3/2024 | Shtykov et al. |
| 2024/0085345 A1 | 3/2024 | Wong |
| 2024/0085470 A1 | 3/2024 | Wong et al. |
| 2024/0094278 A1 | 3/2024 | Shtykov et al. |
| 2025/0093277 A1 | 3/2025 | Koldiaev et al. |
| 2025/0155486 A1 | 5/2025 | Koldiaev et al. |
| 2025/0224327 A1 | 7/2025 | James |

FOREIGN PATENT DOCUMENTS

| | | |
|---|---|---|
| CN | 201837582 | 5/2011 |
| CN | 103441095 | 12/2013 |
| CN | 106415817 | 2/2017 |
| CN | 114678244 | 6/2022 |
| EP | 0 378 061 | 7/1990 |
| EP | 0 436 115 | 7/1991 |
| EP | 0 710 848 | 5/1996 |
| EP | 3 548 854 | 10/2019 |
| JP | 2682465 | 11/1997 |
| JP | 2004-226224 | 8/2004 |
| JP | 2008-218957 | 9/2008 |
| JP | 2016-178122 | 10/2016 |
| KR | 10-2007-0099902 | 10/2007 |
| KR | 10-2012-0071382 | 7/2012 |
| TW | 200421460 | 10/2004 |
| WO | WO 97/41418 | 11/1997 |
| WO | WO 00/55885 | 9/2000 |
| WO | WO 02/065108 | 8/2002 |
| WO | WO 2008/053518 | 5/2008 |
| WO | WO 2011/050264 | 4/2011 |
| WO | WO 2015/027210 | 2/2015 |
| WO | WO 2015/161136 | 10/2015 |
| WO | WO 2016/077617 | 5/2016 |
| WO | WO 2017/041049 | 3/2017 |
| WO | WO 2018/102467 | 6/2018 |
| WO | WO 2019/210229 | 10/2019 |
| WO | WO 2019/210265 | 10/2019 |
| WO | WO 2019/222260 | 11/2019 |

OTHER PUBLICATIONS

"Rapid Non-destructive Characterization of Trap Densities and Layer Thicknesses in $HfO_2$ Gate Materials Using Optical Second Harmonic Generation", Semicon Korea, Santa Ana, California, Jan. 2016, in 24 pages.

Adell, P. C. et al., "Impact of Hydrogen Contamination on the Total Dose Response of Linear Bipolar Micocircuits", IEEE, Aug. 2007, in 8 pages.

Aktsipetrov, O.A. et al. dc-electric field induced and low-frequency electromodulation second-harmonic generation spectroscopy of Si(001)—SiO2 interfaces, Phys. Rev. B, vol. 60(12), Sep. 1999, pp. 8924-8938, in 15 pages.

Alles, M. et al., "Second Harmonic Generation for Noninvasive Metrology of Silicon-on-Insulators Wafers", IEEE Transactions on Semiconductor Manufacturing, vol. 20(2), May 2007, pp. 107-113, in 7 pages.

An, Y. et al., "Role of photo-assisted tunneling in time-dependent second-harmonic generation from Si surfaces with ultrathin oxides", Applied Physics Letters, vol. 102, Feb. 4, 2013, pp. 051602-051602-4, in 5 pages.

Bierwagen, O. et al., "Dissipation-factor-based criterion for the validity of carrier-type identification by capacitance-voltage measurements", Applied Physics Letters, vol. 94, Apr. 2009, pp. 152110-152110-3, in 3 pages.

Bloch, J. et al., "Electron Photoinjection from Silicon to Ultrathin $SiO_2$ Films via Ambient Oxygen", Physical Review Letters vol. 77(5), Jul. 29, 1996, pp. 920-923, in 4 pages.

Campagnola, P., "Second Harmonic Generation Imaging Microscopy: Applications to Diseases Diagnostics", Analytical Chemistry, May 2011, pp. 3224-3231, in 16 pages.

Chang, C. L. et al., "Direct determination of flat-band voltage for metal/high K oxide/semiconductor heterointerfaces by electric-field-induced second-harmonic generation", Applied Physics Letters vol. 98, Apr. 2011, pp. 171902-171902-3, in 3 pages.

Dautrich, M. et al., "Noninvasive nature of corona charging on thermal Si/SiO2 structures", Applied Physics Letters, vol. 85(10), Sep. 6, 2004, pp. 1844-1845, in 2 pages.

De Vries, J. et al., "Measuring the concentration and energy distribution of interface states using a non-contact corona oxide semiconductor method", Applied Physics Letters, vol. 100, Feb. 24, 2012, pp. 082111-082111-3, in 3 pages.

Dixit, S. K. et al., "Radiation Induced Charge Trapping in Ultrathin $HfO_2$-Based MOSFETs", IEEE Transactions on Nuclear Science, vol. 54(6), Dec. 2007, pp. 1883-1890, in 8 pages.

Erley, G. et al., "Silicon interband transitions observed at Si(100)-$SiO_2$ interfaces", Physical Review B, vol. 58(4), Jul. 15, 1998, pp. R1734-R1737, in 4 pages.

(56)                 References Cited

OTHER PUBLICATIONS

Esqueda, I. et al., "Modeling the Effects of Hydrogen on the Mechanisms of Dose Rate Sensitivity", RADECS 2011 Proceedings—A-1, Sep. 2011, pp. 1-6, in 6 pages.

Fomenko, V. et al., "Optical second harmonic generation studies of ultrathin high-k dielectric stacks", Journal of Applied Physics, American Institute of Physics, vol. 97(8), Apr. 11, 2005, in 8 pages.

Fomenko, V. et al., "Second harmonic generation investigations of charge transfer at chemically-modified semiconductor interfaces", Journal of Applied Physics, vol. 91(7), Apr. 1, 2002, pp. 4394-4398, in 5 pages.

Geiger, F., "Second Harmonic Generation, Sum Frequency Generation and $X^{(3)}$: Dissecting Environmental Interfaces with a Nonlinear Optical Swiss Army Knife", Annual Review of Physical Chemistry, vol. 60(1), Nov. 2008, pp. 61-83, in 25 pages.

Gielis, J. J. H. et al., "Negative charge and charging dynamics in $Al_2O_3$ films on Si characterized by second-harmonic generation", Journal of Applied Physics, American Institute of Physics, vol. 104(7), Nov. 2008, pp. 073701-073701-5, in 6 pages.

Gielis, J. J. H. et al., "Optical second-harmonic generation in thin film systems", Journal of Vacuum Science Technology A, vol. 26(6), Nov./Dec. 2008, pp. 1519-1537, in 20 pages.

Glinka, Y. D. et al., "Ultrafast dynamics of interfacial electric fields in semiconductor heterostructures monitored by pump-probe second-harmonic generation", Applied Physics Letter, vol. 81(20), Nov. 11, 2002, pp. 3717-3719, in 3 pages.

Heinz, T. F. et al., "Optical Second-Harmonic Generation from Semiconductor Surfaces", Advances in Laser Science III, edited by A. C. Tam, J. L. Cole and W. C. Stwalley (American Institute of Physics, New York, 1988) p. 452, in 8 pages.

Istratov, A. et al., "Exponential analysis in physical phenomena", Review of Scientific Instruments, vol. 70(2), , Feb. 1999, pp. 1233-1257, in 25 pages.

Jiang, Y. et al., "Finite difference method for analyzing band structure in semiconductor heterostructures without spurious solutions", Journal of Applied Physics, vol. 116(17), Nov. 2014, pp. 173702-173702-9, in 10 pages.

Jozwikowska, A., "Numerical solution of the nonlinear Poisson equation for semiconductor devices by application of a diffusion-equation finite difference scheme", Journal of Applied Physics, vol. 104, Oct. 2008, pp. 063715-1 to 063715-9, in 10 pages.

Jun, H. et al., "Charge Trapping in Irradiated SOI Wafers Measured by Second Harmonic Generation", IEEE Transactions on Nuclear Science, vol. 51(6), Dec. 2004, pp. 3231-3237, in 8 pages.

Kang, A. Y. et al., "The Radiation Response of the High Dielectric-Constant Hafnium Oxid/Silicon System", IEEE Transactions on Nuclear Science, vol. 49(6), Dec. 2002, pp. 2636-2642, in 7 pages.

Katsube, T. et al., "Memory Traps in MNOS Diodes Measured by Thermally Stimulated Current", Solid State Electronics, vol. 19(1), Jan. 1976, pp. 11-16, in 6 pages.

Koldyaev, V. et al., "Rapid Non-Destructive Detection of Sub-Surface Cu in Silicon-On-Insulator Wafers by Optical Second Harmonic Generation", ASMC, May 2015, in 4 pages.

Lantz, J. et al., "Time-Resolved Optical Second Harmonic Generation Measurements of Picosecond Band Flattening Processes at Single Crystal Ti02 Electrodes", The Journal of Physical Chemistry, vol. 98(38), Sep. 1994, pp. 9387-9390, in 4 pages.

Lei, M. et al., "Hot carrier injection from nanometer-thick silicon-on-insulator films measured by optical second harmonic generation", Applied Physics Letters, vol. 96, Jul. 2010, pp. 241105-241105-3, in 3 pages.

Lundstrom, I. et al., "Tunneling to traps in insulators", Journal of Applied Physics, vol. 43(12), Dec. 1972, pp. 5045-5047, in 4 pages.

Lupke, G. et al., "Electron Trapping in Ultrathin $SiO_2$ on Si(001) Probed by Electric-Field-Induced Second-Harmonic Generation", IEEE Nonlinear Optics: Materials, Fundamentals and Applications—Conference Proceedings, MC22, Aug. 1998, pp. 89-91, in 3 pages.

Mandoc, M. M. et al., "Corona Charging and Optical Second-Harmonic Generation Studies of the Field-Effect Passivation of c-SI by Al2O3 Films", IEEE, Jul. 2010, in 5 pages.

Marano, S. et al., "Sequential Detection of Almost-Harmonic Signals", IEEE Transactions on Signal Processing, vol. 51(2), Feb. 2003, pp. 395-406, in 12 pages.

Marka, Z. et al., "Band offsets measured by internal photo-emission-induced second-harmonic generation", Physical Review B, vol. 67(4), Jan. 2003, pp. 045302-045302-5, in 6 pages.

Marka, Z. et al., "Band offsets measurement of Si-$SiO_2$ interfaces by internal photoemission induced second-harmonic generation", Physical Review Journal, paper QTuM6, 2003, in 2 pages.

Marka, Z. et al., "Characterization of X-Ray Radiation Damage in Si/$SiO_2$ Structures Using Second-Harmonic Generation", IEEE Transactions on Nuclear Science, vol. 47(6), Dec. 2000, pp. 2256-2261, in 6 pages.

Marka, Z. et al., "Two-color optical technique for characterization of x-ray radiation-enhanced electron transport in $SiO_2$", Journal of Applied Physics, vol. 93(4), Feb. 15, 2003, pp. 1865-1870, in 6 pages.

Mihaychuk, J. G. et al., "Time-dependent second-harmonic generation from the Si-$SiO_2$ interface induced by charge transfer", Optics Letters, vol. 20(20), Oct. 1995, pp. 2063-2065, in 4 pages.

Murzina, T. et al., "Optical Second Harmonic Generation in Semiconductor Nanostructures", Physics Research International, vol. 2012, Mar. 16, 2012, in 12 pages.

Nagel, J. et al., "Solving the Generalized Poisson Equation Using the Finite-Difference Method (FDM)", Feb. 15, 2012, pp. 1-18, in 18 pages.

Neethling, P. H. et al., "Second harmonic generation as a technique to probe buried interfaces", South African Journal of Science, vol. 105, Jul./Aug. 2009, pp. 282-284, in 3 pages.

Park, H. et al., "Total Ionizing Dose Effects on Strained $HfO_2$-Based nMOSFETs", IEEE Transactions on Nuclear Science, vol. 55(6), Dec. 2008, pp. 2981-2985, in 5 pages.

Pasternak, R. et al., "Laser detection of radiation enhanced electron transport in ultra-thin oxides", Nuclear Instruments and Methods in Physics Research A, vol. 514, 2003, pp. 150-155, in 6 pages.

Pedersen, K. et al., "Spectroscopic second-harmonic generation from silicon-on-insulator wafers", Optical Society of America, vol. 26(5), May 2009, pp. 917-922, in 6 pages.

Powell, R. D., "The Use of Photoinjection to Determine Oxide Charge Distributions and Interface Properties in MOS Structures", IEEE Transactions on Nuclear Sciences, vol. 17(6), Jan. 1971, pp. 41-46, in 6 pages.

Price, J. et al., "Charge trapping defects in Si/$SiO_2$/$Hf_{(1-x)}Si_xO_2$ film stacks characterized by spectroscopic second-harmonic generation", Journal of Vacuum Science and Technology: Part B, AVS/SIP, vol. 29(4), Jul. 2011, pp. 4D101-4D101-11, in 12 pages.

Price, J. et al., "Optical second-harmonic generation study of charge trapping dynamics in $HfO_2$/$SiO_2$ films on Si(100)", Physica Status Solidi, vol. 5(8), Jun. 2008, pp. 2667-2670, in 4 pages.

Rai, V. N. et al., "A transistorized Marx bank circuit providing sub-nanosecond high-voltage pulses", Measurement Science and Technology, vol. 5(4), Nov. 1993, pp. 447-449, in 3 pages.

Reber, R. et al., "Thermally stimulated current measurements of $SiO_2$ defect density and energy in irradiated metal-oxide-semiconductor capacitors", Review of Scientific Instruments, vol. 63(12), Jun. 4, 1998, pp. 5714-5725, in 13 pages.

Robertson, J., "Band offsets of wide-band-gap oxides and implications for future electronic devices", Journal of Vacuum Science and Technology B, vol. 18(3), May 2000, pp. 1785-1791, in 7 pages.

Schaller, R. D. et al., "Time-Resolved Second Harmonic Generation Near-Field Scanning Optical Microscopy", CHEMPHYSCHEM, vol. 4(11), Nov. 14, 2003, pp. 1243-1247, in 5 pages.

Shaver, J. et al., "A 2D Finite Difference Simulation to Investigate the High Voltage Blocking Characteristics of 4H-SiC Photoconductive Semiconductor Switches", IEEE, 978-1-4799-8403-9/15, May 2015, pp. 193-195, in 3 pages.

Taguchi, D. et al., "Probing of carrier behavior in organic electroluminescent diode using electric field induced optical second-harmonic generation measurement", Applied Physics Letters, vol. 95, Dec. 30, 2009, pp. 263310-263310-3, in 4 pages.

(56)            References Cited

OTHER PUBLICATIONS

Tian, Y. et al., "Corona Discharge Radical Emission Spectroscopy: A Multi-Channel Detector with Nose-Type Function for Discrimination Analysis", The Analyst, The Royal Society of Chemistry, vol. 138(8), Mar. 2013, in 15 pages.
Ushiki, T. et al., "Evidence of Energetically-Localized Trap-States at SOI-BOX Interface in High-Dose SIMOX Wafers", IEEE International SOI Conference, Oct. 1999, pp. 48-49, in 2 pages.
Vanbel, M. K. et al., "Electric-Field-Induced Second-Harmonic Generation Demonstrates Different Interface Properties of Molecular Beam Epitaxy Grown MgO on Si", The Journal of Physical Chemistry, vol. 118(4), Jan. 2014, in 6 pages.
Vanbel, M. K. et al., "Tunneling of holes is observed by second-harmonic generation", Applied Physics Letters, vol. 102(8), Feb. 2013, in 5 pages.
Vasudevan, V. et al., "A numerical simulation of hole and electron trapping due to radiation in silicon dioxide", Journal of Applied Physics, vol. 70, Nov. 1991, pp. 4490-4495, in 7 pages.
Wang, H. et al., "Non-degenerate fs pump-probe study on InGaN with multi-wavelength second-harmonic generation", Optics Express, Jul. 11, 2005, vol. 13(14), pp. 5245-5252, in 8 pages.
Wang, W. et al., "Coupled Electron-Hole Dynamics at the $Si/SiO_2$ Interface", Physical Review Letters, vol. 81(19), Nov. 9, 1998, pp. 4224-4227, in 4 pages.
White, Y. V. et al., "Studies of charge carrier trapping and recombination processes in Si $SiO_2$ MgO structures using second-harmonic generation", Applied Physics Letters, vol. 88, Feb. 2006, pp. 062102-062102-3, in 3 pages.
Xiao, D. et al., "Optical probing of a silicon integrated circuit using electric-field-induced second-harmonic generation", Applied Physics Letters, vol. 88, Mar. 17, 2006, pp. 114107-114107-3, in 4 pages.
Chinese Office Action dated Mar. 20, 2020 in corresponding CN Application No. 201680064010.9.
European Extended Search Report dated Feb. 26, 2019 in corresponding EP Application No. 16843152.6.
European Extended Search Report dated Sep. 28, 2017 in corresponding EP Application No. 15779557.6.
European Interview Summary Report dated Apr. 28, 2020 in corresponding EP Application No. 15779557.6.
European Office Action dated May 4, 2020 in corresponding EP Application No. 15779557.6.
European Extended Search Report dated Apr. 3, 2018 in corresponding EP Application No. 15858539.8.
European Office Action dated Aug. 30, 2019 in corresponding EP Application No. 15858539.8.
International Search Report and Written Opinion dated Dec. 21, 2016 in corresponding PCT Application No. PCT/US2016/050286.
International Preliminary Report on Patentability and Written Opinion dated Mar. 6, 2018 in corresponding PCT Application No. PCT/US2016/050286.
Invitation to Pay Addition Fees and Partial Search Report dated Jul. 27, 2015 in corresponding PCT Application No. PCT/US2015/026263.
International Search Report and Written Opinion dated Sep. 23, 2015 in corresponding PCT Application No. PCT/US2015/026263.
International Preliminary Report on Patentability and Written Opinion dated Oct. 27, 2016 in corresponding PCT Application No. PCT/US2015/026263.
International Search Report and Written Option dated Feb. 26, 2016 in corresponding PCT Application No. PCT/US2015/060437.
International Preliminary Report on Patentability and Written Opinion dated May 26, 2017 in corresponding PCT Application No. PCT/US2015/060437.
International Search Report and Written Option dated Aug. 13, 2019 in corresponding PCT Application No. PCT/US2019/029485.
International Preliminary Report on Patentability dated Nov. 5, 2020 in corresponding PCT Application No. PCT/US2019/029485.
International Search Report and Written Opinion dated Sep. 25, 2019 in corresponding PCT Application No. PCT/US2019/032282.

International Preliminary Report on Patentability dated Nov. 26, 2020 in corresponding PCT Application No. PCT/US2019/032282.
International Search Report and Written Option dated Aug. 8, 2019 in corresponding PCT Application No. PCT/US2019/029439.
International Preliminary Report on Patentability dated Nov. 5, 2020 in corresponding PCT Application No. PCT/US2019/029439.
Taiwanese Office Action dated Sep. 28, 2017 in corresponding TW Application No. 105131588.
U.S. Office Action dated Jul. 13, 2018 in corresponding U.S. Appl. No. 15/256,442.
U.S. Office Action dated Apr. 4, 2019 in corresponding U.S. Appl. No. 15/256,442.
U.S. Office Action dated Jul. 26, 2019 in corresponding U.S. Appl. No. 15/256,442.
U.S. Office Action dated May 1, 2020 in corresponding U.S. Appl. No. 15/256,442.
U.S. Office Action dated Oct. 13, 2020 in corresponding U.S. Appl. No. 15/256,442.
U.S. Office Action dated Feb. 8, 2017 in corresponding U.S. Appl. No. 14/690,179.
U.S. Office Action dated Aug. 28, 2017 in corresponding U.S. Appl. No. 14/690,179.
U.S. Office Action dated Jan. 14, 2019 in corresponding U.S. Appl. No. 15/882,433.
U.S. Office Action dated Jul. 25, 2019 in corresponding U.S. Appl. No. 15/882,433.
U.S. Office Action dated Nov. 6, 2019 in corresponding U.S. Appl. No. 15/882,433.
U.S. Office Action dated Oct. 13, 2016 in corresponding U.S. Appl. No. 14/690,256.
U.S. Office Action dated Jul. 28, 2017 in corresponding U.S. Appl. No. 14/690,256.
U.S. Office Action dated Oct. 31, 2018 in corresponding U.S. Appl. No. 15/880,308.
U.S. Office Action dated May 1, 2017 in corresponding U.S. Appl. No. 14/690,251.
U.S. Office Action dated Jun. 25, 2018 in corresponding U.S. Appl. No. 15/799,594.
U.S. Office Action dated Apr. 17, 2019 in corresponding U.S. Appl. No. 15/799,594.
U.S. Office Action dated Sep. 5, 2019 in corresponding U.S. Appl. No. 15/799,594.
U.S. Office Action dated Jan. 7, 2020 in corresponding U.S. Appl. No. 15/799,594.
U.S. Office Action dated Sep. 3, 2020 in corresponding U.S. Appl. No. 16/703,709.
U.S. Office Action dated Oct. 7, 2016 in corresponding U.S. Appl. No. 14/690,279.
U.S. Office Action dated May 8, 2017 in corresponding U.S. Appl. No. 14/690,279.
U.S. Office Action dated Sep. 18, 2018 in corresponding U.S. Appl. No. 15/806,271.
U.S. Office Action dated Mar. 29, 2019 in corresponding U.S. Appl. No. 15/806,271.
U.S. Office Action dated Oct. 28, 2019 in corresponding U.S. Appl. No. 15/806,271.
U.S. Office Action dated Feb. 5, 2018 in corresponding U.S. Appl. No. 14/939,750.
U.S. Office Action dated Jun. 26, 2018 in corresponding U.S. Appl. No. 14/939,750.
U.S. Office Action dated Feb. 13, 2019 in corresponding U.S. Appl. No. 14/939,750.
U.S. Office Action dated Sep. 24, 2019 in corresponding U.S. Appl. No. 14/939,750.
U.S. Office Action dated Feb. 5, 2021 in corresponding U.S. Appl. No. 16/724,042.
U.S. Office Action dated Aug. 27, 2020 in corresponding U.S. Appl. No. 16/396,455.
U.S. Office Action dated Jun. 17, 2020 in corresponding U.S. Appl. No. 16/412,216.
Chinese Office Action dated Mar. 2, 2021 in corresponding CN Application No. 201680064010.9.

(56) References Cited

OTHER PUBLICATIONS

Chinese Office Action dated Sep. 13, 2021 in corresponding CN Application No. 201680064010.9.

European Office Action dated Aug. 27, 2021 in corresponding EP Application No. 15779557.6.

U.S. Office Action dated Mar. 31, 2021 in corresponding U.S. Appl. No. 15/256,442.

U.S. Office Action dated Jun. 10, 2021 in corresponding U.S. Appl. No. 16/841,324.

U.S. Office Action dated Apr. 13, 2021 in corresponding U.S. Appl. No. 16/703,709.

U.S. Office Action dated Sep. 13, 2021 in corresponding U.S. Appl. No. 16/703,709.

U.S. Office Action dated Apr. 20, 2021 in corresponding U.S. Appl. No. 16/773,693.

U.S. Office Action dated Aug. 13, 2021 in corresponding U.S. Appl. No. 16/724,042.

U.S. Office Action dated May 5, 2021 in corresponding U.S. Appl. No. 16/396,455.

Adams, M.L.C., "Silicon surface passivation by thin films studied by corona charging", Eindhoven University of Technology, Master's Thesis, Mar. 2011, in 68 pages.

Shaffer, E. et al., "Digital holographic microscopy investigation of second harmonic generated at a glass/air interface", Optics Letters, Aug. 2009, vol. 34, No. 16, pp. 2450-2452.

European Office Action dated Jan. 31, 2022 in corresponding EP Application No. 19803197.3.

European Office Action dated Jan. 20, 2022 in corresponding EP Application No. 19793928.3.

Korean Office Action dated Nov. 30, 2021 in corresponding KR Application No. 10-2016-7032204.

U.S. Office Action dated Nov. 10, 2021 in corresponding U.S. Appl. No. 16/773,693.

U.S. Office Action dated Nov. 29, 2021 in corresponding U.S. Appl. No. 16/396,455.

International Search Report and Written Opinion dated Oct. 30, 2023 in corresponding PCT Application No. PCT/US2023/069955.

International Search Report and Written Opinion dated Nov. 7, 2023 in corresponding PCT Application No. PCT/US2023/069948.

International Search Report and Written Opinion dated Oct. 27, 2023 in corresponding PCT Application No. PCT/US2023/069967.

Aktsipetrov, O.A. et al., "dc-electric-field-induced second-harmonic generation in Si(111)-$SiO_2$-Cr metal-oxide-semiconductor structures", Physical Review B, Jul. 1996, vol. 54, pp. 1825-1832.

Fang, J. et al., "Detection of gate oxide charge trapping by second-harmonic generation", Applied Physics Letters, Nov. 1999, vol. 75, pp. 3506-3508.

Hu, C. C., *Modern Semiconductor Devices for Integrated Circuits*, Mar. 2009, 1st Edition, published by Pearson, 351 pages, ISBN-10: 8131730247, ISBN-13: 978-0136085256 (the NPL document submitted includes only the Title Overview and Table of Contents listing of this book).

Third-Party Submission dated May 30, 2022 in corresponding KR Application No. 10-2020-7034153.

Third-Party Submission dated Jun. 30, 2022 in corresponding KR Application No. 10-2020-7035967.

Taiwanese Office Action with Search Report dated Apr. 10, 2023 in corresponding TW Application No. 108124174.

Chinese Office Action and Search Report dated Feb. 28, 2024 in corresponding CN Application No. 201980043576.7

Chinese Office Action and Search Report dated Oct. 24, 2024 in corresponding CN Application No. 201980043576.7.

Chinese Office Action dated Mar. 26, 2025 in corresponding CN Application No. 201980043576.7.

"Basis of lon Implanter" edited by Beijing Municipal Radiation Center, Beijing Press, Sep. 1981, pp. 310-311.

"Push-pull output", Wikipedia, accessed Aug. 22, 2025, in 6 pages. URL: https://en.wikipedia.org/wiki/Push%E2%80%93pull_output.

* cited by examiner

FIELD-BIASED NONLINEAR OPTICAL METROLOGY USING CORONA DISCHARGE SOURCE

CROSS-REFERENCE TO RELATED APPLICATIONS

This application claims benefit under 35 U.S.C. § 119(e) of U.S. Provisional Application No. 62/663,925, filed on Apr. 27, 2018, titled "Parametric Modeling for Interfacial Electric Properties by SHG Measurement."

INCORPORATION BY REFERENCE STATEMENT

U.S. Provisional Application No. 61/980,860, filed on Apr. 17, 2014, titled "WAFER METROLOGY TECH-NOLOGIES" is incorporated by reference herein in its entirety, including but not limited to each of the Sections I, II, III, and IV, which are each incorporated herein by reference in their entirety. U.S. patent application Ser. No. 14/690,251, filed on Apr. 17, 2015, titled "FIELD-BIASED SECOND HARMONIC GENERATION METROLOGY" published as U.S. Patent Publication 2015/0331036 is incorporated by reference herein in its entirety.

FIELD

The subject filing relates to systems for Second Harmonic Generation (SHG) based wafer inspection, semiconductor metrology, materials characterization, surface characterization and/or interface analysis.

BACKGROUND

In nonlinear optics, light beam input(s) are output as the sum, difference or harmonic frequencies of the input(s). Second Harmonic Generation (SHG) is a non-linear effect in which light is emitted from a material at a reflected angle with twice the frequency of an incident source light beam. The process may be considered as the combining of two photons of energy E to produce a single photon of energy 2E (i.e., the production of light of twice the frequency ($2\omega$) or half the wavelength) of the incident radiation.

A survey of scientific investigations in which the SHG technique has been employed is provided by, "Optical Second-Harmonic Generation from Semiconductor Surfaces" by T. F. Heinz et al., Published in Advances in Laser Science III, edited by A. C. Tam, J. L. Cole and W. C. Stwalley (American Institute of Physics, New York, 1988) p. 452. As reviewed, the SHG process does not occur within the bulk of materials exhibiting a center of symmetry (i.e., in inversion or centrosymmetric materials). For these materials, the SHG process is appreciable only at surfaces and/or interfaces where the inversion symmetry of the bulk material is broken. As such, the SHG process offers a unique sensitivity to surface and interface properties.

So-understood, the SHG effect is described in U.S. Pat. No. 5,294,289 to Heinz et al. Each of U.S. Pat. No. 5,557,409 to Downer, et al., U.S. Pat. Nos. 6,795,175; 6,781,686; 6,788,405; 6,819,844; 6,882,414 and 7,304,305 to Hunt, U.S. Pat. No. 6,856,159 to Tolk, et al. and U.S. Pat. No. 7,158,284 to Alles, et al. also describe other approaches or "tools" that may be employed. Yet, the teachings of these patents appear not to have overcome some of the main obstacles to the adoption of SHG as an established technique for use in semiconductor manufacturing and metrology.

SUMMARY

Various field-biased (e.g., magnetic-field biases, DC bias and/or voltage bias induced by an AC field alone, with a capacitive coupling and/or a changing magnetic field) SHG-based systems and their methods of use are described. Biasing with corona discharge is also described. These are treated in turn. They may be used independently and/or in a combined system. Various embodiments described herein include each of the methodology associated with the approaches described above, hardware to carry out the methodology, productions systems incorporating the hardware and products (including products-by-process) thereof
Magnetic Field Bias A static or changing magnetic field applied to the sample will cause the second order optical susceptibility tensor of a material to change. Thus, a magnetic field could be used to increase SHG signal from the sample, to an optimum value. Moreover, a changing magnetic field can be used to induce bias as further discussed below.
Induced Voltage Bias for Eliminating DC Contact Probes Systems and methods are described for characterizing the SHG response of a layered semiconductor material that is subjected to a discrete electric field across its interfaces without use of contact bias probes in a system that can synchronize the pulses of a probing laser and/or the gating of a detector with a predetermined amplitude of voltage of an AC, variable or pulsed bias applied to the sample to produce a corresponding or coordinated induced voltage field at the surface to be interrogated.

The subject hardware comprises an SHG apparatus (e.g., further described in the portion of U.S. Provisional Application No. 61/980,860, filed on Apr. 17, 2014, titled "Wafer Metrology Technologies," referred to as Section II titled, "Charge Decay Measurement Systems and Methods," which is incorporated herein by reference in its entirety) together with a means of inducing (e.g., a component configured to induce) a voltage at or along the "device" surface of a sample without contact. (See also U.S. patent application Ser. No. 14/690,256, filed Apr. 17, 2015 titled "Charge Decay Measurement Systems and Methods", published as U.S. Publication No. 2015/0331029, which is incorporated herein by reference in its entirety.) Such means or component may be either via backside contact with probes or a conductive chuck, involving capacitively coupled probes connected to a power source also in communication with backside contact probes or such a chuck, or by applying a changing magnetic field to the sample, with the purpose of inducing an external voltage field across its multilayer interfaces.

A transient electric field produced by a variable waveform (optionally AC) power supply (via any of the approaches above) induces an electric field across the interfaces of the multilayer semiconductor material. The relationship between the voltage and the material interface electrical field may be modeled by a transfer function or otherwise, including by accounting for various (capacitive or otherwise) external influences. The output of this function, given a particular amplitude and frequency of AC (or other) current, may be employed as a timing cue to trigger the laser shutter and/or photon counter simultaneously for SHG character-ization of the testing point for constant near-instantaneous values of the electric field amplitude at the interfaces. As such, the system is able to simulate a constant (DC) voltage applied topside (i.e., at the device layer of the substrate) via contact electrical probes.

With direct application of AC to the backside of the sample, the system begins with the chuck at a 'neutral' or ground state, and bulk and device layers at an equilibrium potential. Then, an alternating bias is applied to the chuck, which is in galvanic contact with the bulk, or substrate layer of the multilayered semiconductor material. Since the device layer is separated from the bulk by the buried oxide layer, and not directly connected with a conductor, an electric potential field, or voltage will be created (i.e., induced) between the device and bulk layers.

Alternatively, capacitively coupled probe(s) that reside near (within about 1 to about 2 mm) but without touching the top side of the sample may be employed. A preferred approach in this regard may be a plate sized to cover (but not touch) the entire wafer, hovering with a small hole for the incident laser to pass through on its way to the sample and for the SHG beam to pass through on its way out of the sample.

In some implementations, a non-contacting electrode can be implemented using MEMS technology. For example, in an implementation, a Si wafer can be oxidized on both sides. A spiral or a grid-like electrode can then be placed by deposition on one or more locations of the wafer. The oxide material can be removed from the back-side of the wafer at those locations. An electro-magnetic field applied to the electrode can inductively bias the wafer in such implementations through near-field inductive coupling. The magnetic field produced by an external electric current can be used to generate an electric current across the wafer by inducing a current in the deposited electrode. Other methods of implementing non-contacting probes can also be used.

In any case, SHG methodology is used to interrogate the sample, for example, as further described in the portions of U.S. Provisional Application No. 61/980,860, filed on Apr. 17, 2014, titled "Wafer Metrology Technologies," referred to as Section I titled, "Pump and Probe Type SHG Metrology," and/or Section III, titled "Temperature-Controlled Metrology," both of which are incorporated herein by reference in their entirety. See also U.S. patent application Ser. No. 14/690,179, filed Apr. 17, 2015 titled "Pump and Probe Type Second harmonic generation Metrology", published as U.S. Publication No. 2015/0330908, which is incorporated herein by reference in its entirety. The same holds true with respect to the other embodiments discussed below.

Regardless, in the subject embodiments, since it is desirable to monitor SHG as a function of the voltage across the interfaces, the SHG signal will be synchronized with the power supply. This synchronization can be accomplished by controlling the laser(s) used for SHG signal production and SHG signal processing software, the laser(s) alone, or only the SHG signal processing software, in time with voltage changes. The voltage of the chuck can also be controlled.

An advantage of this synchronization is that voltage biased SHG measurements can be obtained that would be similar to DC biased SHG measurements, without using contact voltage bias probes on the front surface of the wafer. Instead of applying a DC bias, the system would use an AC bias synchronized with SHG measurement and/or generation to collect SHG data at discrete points on the voltage cycle. The AC bias could be applied using near-field inductive coupling, or via capacitive coupling of the sample. SHG data collected with these biasing techniques would yield the same material properties information as DC biased SHG.

To reduce or minimize noise and obtain statistically relevant indicator(s) of SHG intensity as a function of voltage across the interfaces, multiple photon counting windows may be desirable as further described below.

Induced Voltage Bias for Characterizing Interfacial Leakage

Systems and methods are described for characterizing interfacial leakage current and/or carrier injection energies between layers of layered (e.g., semiconductor) materials using SHG and a voltage change (such as an alternating, variable and/or pulsed voltage or current signal or a device that changes magnetic field in a manner to induce voltage change in a device layer of a sample) applied to the layered semiconductor material as per above.

By measuring the SHG response from optical pulses generated by a pulsed laser directed at a layered semiconductor/dielectrics structure while or shortly after an alternating, variable or pulsed voltage is applied to the layered semiconductor material, interfacial leakage current and/or carrier injection energies between layers can be characterized. In some embodiments, the time evolution of the SHG signal from interfaces as a function of the time constant of decay of the induced voltage can be measured. This yields information about charge carrier mobility across the interfaces.

Induced Voltage Bias for Characterizing Threshold Carrier Injection Energy

Systems and methods are described for SHG measurement applied in connection with a varied electrical field at a sample device layer in lieu of using tunable wavelength laser excitation to determine energy thresholds for photo-induced charge carrier injection into the dielectric in a layered semiconductor material. More specifically, to measure the threshold energy necessary for photo-induced charge carrier injection into the dielectric one can expose the material to a substantially monochromatic incident photon beam for SHG production and then incrementally change voltage across an interface of the exposed layered semiconductor material, measuring SHG signal count at each incremental voltage change until the SHG response has significant inflection or discontinuity or sudden change in slope from prior measurements. This change in slope could be a maximum or minimum (e.g., local maximum or minimum) or cusp, or step function, etc. The net charge change transfer due to all these processes can be described as the integral of the contributions of the 3rd harmonic injection current, "forward" leakage current to the dielectric due to the strong electric field, and "backward" discharge leakage current. Put in equation form:

$$Q(t) = \int (I_X + I_E - I_L) dt$$

Kinetic features of this curve shape (bending moment and saturation moments of time) will then provide information for determining threshold carrier injection energy.

Corona Charging

Apparatus for optical second harmonic generation detection under corona charging is also described herein. The subject hardware may comprises an SHG apparatus or other type of optical interrogation system with a corona discharge source (e.g., corona gun) for delivering or depositing one or more charges Q to a sample. The sample can comprise a semiconductor material. For example, the sample can comprise a semiconductor device, a semiconductor wafer, a semiconductor chip, a bulk semiconductor material, a heterojunction, etc. An external voltage source may be connected between the sample and the corona discharge source to deliver or deposit one or more charges Q on the sample in some implementations.

Four-Wave Mixing and Multi-Wave Mixing

In various implementations of metrology systems employing corona charging, optical signals that are generated by other non-linear optical processes such as four-wave mixing and multi-wave mixing can be used to determine various characteristics (e.g., electrical properties of an interfacial region) of a semiconductor device. Four-wave mixing and multi-wave mixing are non-linear optical phenomena in which two or more incident beams at same or different optical frequencies interact with each other as a result of higher order non-linear susceptibilities of a non-linear medium to generate optical signals having an optical frequency or optical frequencies different than the two or more incident beams. In various implementations a metrology system for characterizing properties of a sample is configured to measure four-wave or multi-wave mixing signals in the presence of charges deposited by a corona discharge source.

The systems, methods and devices disclosed herein each have several innovative aspects, no single one of which is solely responsible for the desirable attributes disclosed herein. A variety of example systems and methods are provided below.

Embodiment 1

A method of optical interrogation of a sample having a top side and a bottom side, the method comprising:

applying probing radiation from a probing optical source to a surface of the sample; depositing different amounts of electrical charge to the top side of the sample using a corona gun;

detecting using an optical detector, a Second Harmonic Generation (SHG) effect signal generated by the probing radiation for different amounts of electrical charge deposited on the top side of the sample; and determining a characteristic of the variation of the detected SHG effect signal for the different amounts of electrical charge deposited on the top side of the sample.

Embodiment 2

The method of Embodiment 1, used to determine interfacial charging states at corresponding band bending of the sample as a function of surface charge.

Embodiment 3

The method of any of Embodiments 1-2, further comprising:

applying pumping radiation from a pumping optical source to the surface of the sample; detecting a SHG effect signal generated by at least one of the pumping radiation and the probing radiation using an optical detector; and determining a characteristic of the detected SHG effect signal in the presence of said charge and the pumping radiation.

Embodiment 4

The method of Embodiment 3, used to determine carrier dynamics at corresponding band bending of the sample as a function of surface charge.

Embodiment 5

The method of any of Embodiments 1 to 4, further comprising measuring an electrical current between the sample and an electrical ground.

Embodiment 6

The method of any of Embodiments 1 to 4, further comprising determining the different amounts of electrical charge deposited on the top side of the sample.

Embodiment 7

The method of Embodiment 6, further comprising determining the different amounts of electrical charge deposited on the top side of the sample based on the measured electrical current between the sample and the electrical ground.

Embodiment 8

The method of any of Embodiments 1 to 7, wherein the sample comprises a semiconductor.

Embodiment 9

The method of any of Embodiments 1 to 7, wherein the sample comprises an interfacial region between an oxide and a semiconductor or a metal.

Embodiment 10

A system for optically interrogating a surface of a sample accompanied by the application of electric charge to said sample, said system comprising:

a first optical source configured to emit probing optical radiation, said first optical source disposed so as to direct said probing optical radiation onto said surface of said sample;

a corona discharge source disposed with respect to the sample to provide different amounts of electric charge to the sample;

an optical detector configured to detect second harmonic generated light from the sample; and electronics configured to determine a characteristic of the detected second harmonic generated light for the different amounts of the electrical charge.

Embodiment 11

The system of Embodiment 10, wherein said first optical source comprises a laser.

Embodiment 12

The system of Embodiment 11, wherein the first optical source comprises a pulsed laser.

Embodiment 13

The system of Embodiment 11 or 12, wherein the pulsed laser is selected from nanosecond, picosecond and femtosecond lasers.

Embodiment 14

The system of Embodiment 12 or 13, wherein the pulsed laser comprises a tunable wavelength laser.

Embodiment 15

The system of Embodiment 10, further comprising a second optical source, wherein said second optical source comprises a pump optical source configured to emit pumping radiation and said first optical source comprises a probe optical source.

Embodiment 16

The system of Embodiment 15, wherein the pump optical source comprises a UV flash lamp.

Embodiment 17

The system of Embodiment 15, wherein the pump optical source comprises a laser.

Embodiment 18

The system of Embodiment 15, wherein the pump optical source comprises a pulsed laser.

Embodiment 19

The system of Embodiment 18, wherein the pulsed laser is selected from nanosecond, picosecond and femtosecond lasers.

Embodiment 20

The system of Embodiment 18, wherein the pulsed laser comprises a tunable wavelength laser.

Embodiment 21

The system of any of Embodiments 10 to 20, wherein the optical detector is selected from a photomultiplier tube, a CCD camera, an avalanche detector, a photodiode detector, a streak camera and a silicon detector.

Embodiment 22

The system of any of Embodiments 10 to 21, further comprising a Voltage Supply Applying a Voltage Between Said Corona Discharge Source and Said Sample.

Embodiment 23

The system of any of Embodiments 10 to 22, further comprising an electrical sensor configured to measure a current between the sample and an electrical ground.

Embodiment 24

The system of any of Embodiments 10 to 23, wherein the electronics are configured to determine different amounts of electrical charge provided by the corona discharge source.

Embodiment 25

The system of Embodiment 24, wherein the electronics are configured to determine different amounts of electrical charge provided by the corona discharge source based on the measured current between the sample and the electrical ground.

Embodiment 26

The system of Embodiments 24 or 25, wherein the electronics are configured to associate different amounts of SHG signal with the corresponding different amounts of electrical charge provided by the corona discharge source.

Embodiment 27

The system of Embodiment 26, wherein the electronics are configured to determine information regarding to one or more defects in the sample, about interstitial states in the sample, or about regions of depletion, regions of accumulation or regions of inversion in the sample based on the relationship between said different amounts of SHG signal and the corresponding different amounts of electrical charge provided by the corona discharge source.

Embodiment 28

The system of Embodiments 26 or 27, wherein the electronics are configured to associate different amounts of SHG signal with the corresponding different amounts of electrical charge provided by the corona discharge source.

Embodiment 29

The system of Embodiment 28, wherein the electronics are configured to determine information regarding to one or more defects in the sample, about interstitial states in the sample 3020, or about regions of depletion, regions of accumulation or regions of inversion in the sample based on the relationship between said different amounts of SHG signal and the corresponding different amounts of electrical charge provided by the corona discharge source.

Embodiment 30

The system of any of Embodiments 10 to 29, wherein the sample comprises a semiconductor.

Embodiment 31

The system of any of Embodiments 10 to 29, wherein the sample comprises an interfacial region between an oxide and a semiconductor or a metal.

Embodiment 32

A system for optically interrogating a surface of a sample accompanied by the application of electric charge to said sample, said system comprising:
a first optical source configured to emit a first incident beam of light towards said surface of said sample;
a second optical source configured to emit a second incident beam of light towards said surface of said sample;
a corona discharge source disposed with respect to the sample to provide different amounts of electric charge to the sample; and
an optical detection system configured to detect at least one four-wave mixing or at least one multi-wave mixing signal component from the sample for different amounts of electric charge on the sample; and

electronics electrically connected to said optical detection system to receive a signal based on said detected at least one four-wave mixing or at least one multi-wave mixing signal component.

Embodiment 33

The system of Embodiment 32, wherein said first optical source comprises a pulsed optical source configured to output pulses.

Embodiment 34

The system of Embodiment 32 or 33, wherein said second optical source comprises a pulsed optical source configured to output pulses.

Embodiment 35

The system of Embodiment 34, further comprising a system configured to introduce a time delay between the pulses output from the first optical source and the pulses output from the second optical source.

Embodiment 36

The system of any of Embodiments 32 to 35, wherein at least one of said first and second optical sources comprises pulsed lasers configured to output pulses.

Embodiment 37

The system of Embodiments 36, wherein the pulsed laser is selected from nanosecond, picosecond and femtosecond lasers.

Embodiment 38

The system of any of Embodiments 32 to 37, wherein said electronics are configured to determine different amounts of electrical charge provided by the corona discharge source.

Embodiment 39

The system of any of Embodiments 32 to 38, further comprising an electrical sensor configured to measure a current between the sample and an electrical ground.

Embodiment 40

The system of Embodiment 39, wherein said electronics are in electrical communication with said electrical sensor.

Embodiment 41

The system of Embodiment 40, wherein said electronics are configured to determine the different amounts of electrical charge provided by the corona discharge source based on the measured current between the sample and the electrical ground.

Embodiment 42

The system of any of Embodiments 32 to 41, wherein said electronics are configured to determine a characteristic of the at least one four-wave mixing signal component or the at least one multi-wave mixing signal component detected for the different amounts of the electrical charge.

10

Embodiment 43

The system of any of Embodiments 42, wherein the electronics are configured to obtain information related to the sample based on the determined characteristic of the detected at least one four-wave mixing signal component or multi-wave mixing signal component for the different amounts of the electrical charge.

Embodiment 44

The system of any of Embodiments 42, wherein the electronics is configured to obtain information related to charge dynamics of the sample based on the determined characteristic of the detected at least one four-wave mixing signal component or multi-wave mixing signal component for the different amounts of the electrical charge.

Embodiment 45

The system of Embodiments 32 to 44, wherein the electronics are configured to associate different amounts of the at least one four-wave mixing signal component or the at least one at least one multi-wave mixing signal component SHG signal with the corresponding different amounts of electrical charge provided by the corona discharge source.

Embodiment 46

The system of Embodiments 32 to 45, further comprising an optical delay system configured to introduce a variable time delay between optical pulses of the first incident beam and the second incident beam.

Embodiment 47

The system of Embodiment 46, wherein the electronics is configured to determine information related to the sample based on the detected at least one four-wave mixing signal component or at least one multi-wave mixing signal component for different amounts of variable time delay and for different amounts of the electrical charge.

Embodiment 48

The system of Embodiment 46, wherein the electronics is configured to determine information related to charge dynamics of the sample based on the detected at least one four-wave mixing signal component or at least one multi-wave mixing signal component for different amounts of variable time delay and for different amounts of the electrical charge.

Embodiment 49

The system of any of Embodiments 32 to 48, wherein the optical detection system configured to detect at least one four-wave mixing signal component from the sample.

Embodiment 50

The system of any of Embodiments 32 to 48, wherein the optical detection system configured to detect at least one multi-wave mixing signal component from the sample.

Embodiment 51

The system of any of Embodiments 32 to 50, wherein the sample comprises a semiconductor.

Embodiment 52

The system of any of Embodiments 32 to 50, wherein the sample comprises an interfacial region between an oxide and a semiconductor or a metal.

Embodiment 53

A method of optical interrogation of a sample having a top side and a bottom side, the method comprising:
directing a first incident beam from a first optical source towards a region on a surface of the sample;
directing a second incident beam from a second optical source towards the region on the surface of the sample;
depositing different amounts of electrical charge on the top side of the sample using a corona gun;
detecting using an optical detection system, at least one four-wave mixing signal component or at least one multi-wave mixing signal component from the sample generated by the first incident beam and the second incident beam for different amounts of electrical charge deposited on the top side of the sample.

Embodiment 54

The method of Embodiment 53, further comprising determining information related to the sample based on the detected at least one four-wave mixing signal component or at least one multi-wave mixing signal component.

Embodiment 55

The Method of Embodiment 53, Further Comprising Determining information related to charge dynamics of the sample based on the detected at least one four-wave mixing signal component or at least one multi-wave mixing signal component.

Embodiment 56

The method of Embodiment 53, further comprising determining a characteristic of the at least one four-wave mixing signal component or at least one multi-wave mixing signal component for the different amounts of electrical charge deposited on the top side of the sample.

Embodiment 57

The method of Embodiment 53, further comprising determining information related to charge dynamics of the sample based on the determined characteristic of the detected at least one four-wave mixing signal component or at least one multi-wave mixing signal component for different amounts of the electrical charge.

Embodiment 58

The method of any of Embodiments 53 to 57, wherein the first incident beam and the second incident beam comprise optical pulses.

Embodiment 59

The method of Embodiment 58, further comprising introducing a variable time delay between the optical pulses of the first incident beam and the second incident beam.

Embodiment 60

The method of Embodiment 59, further comprising determining information related to the sample based on the detected at least one four-wave mixing signal component or at least one multi-wave mixing signal component for different amounts of variable time delay and for different amounts of the electrical charge.

Embodiment 61

The method of Embodiment 59, further comprising determining information related to charge dynamics of the sample based on the detected at least one four-wave mixing signal component or at least one multi-wave mixing signal component for different amounts of variable time delay and for different amounts of the electrical charge.

Embodiment 62

The system of any of Embodiments 53 to 61, wherein at least one four-wave mixing signal component is detected by the optical detection system.

Embodiment 63

The system of any of Embodiments 53 to 61, wherein at least one multi-wave mixing signal component is detected by the optical detection system.

Embodiment 64

The method of any of Embodiments 53 to 63, wherein the sample comprises a semiconductor.

Embodiment 65

The method of any of Embodiments 53 to 63, wherein the sample comprises an interfacial region between an oxide and a semiconductor or a metal.

Embodiment 66

The method of any of Embodiments 1 to 9, further comprising applying pump radiation.

Embodiment 67

The method of any of Embodiments 1 to 9 or 66, wherein interrogation of the sample is performed in-line while the sample is in a fabrication or production line.

Embodiment 68

The system of any of Embodiments 10 to 31, wherein the system is configured to interrogate the sample in-line while the sample is in a fabrication or production line.

Embodiment 69

The system of any of Embodiments 32 to 52, wherein the system is configured to interrogate the sample in-line while the sample is in a fabrication or production line.

Embodiment 70

The method of any of Embodiments 53 to 65, wherein interrogation of the sample is performed in-line while the sample is in a fabrication or production line.

BRIEF DESCRIPTION OF THE DRAWINGS

The figures diagrammatically illustrate aspects of various embodiments of different inventive variations.

DETAILED DESCRIPTION

Figures 1A, 1B:
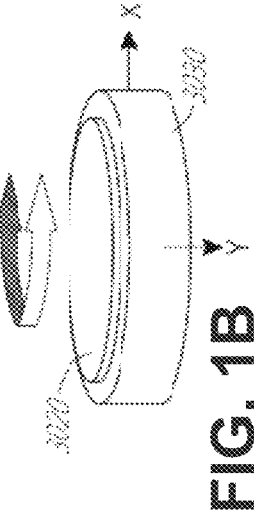
FIGS. 1A and 1B are schematic diagrams of SHG system components as may be used herein.

FIGS. 1A and 1B show suitable hardware for use in the subject systems and methods as further described in the portion of U.S. Provisional Application No. 61/980,860, filed on Apr. 17, 2014, titled "Wafer Metrology Technologies," referred to as Section I entitled "Pump and Probe Type SHG Metrology," which is incorporated by reference in its entirety. See also U.S. patent application Ser. No. 14/690, 179, filed Apr. 17, 2015 titled "Pump and Probe Type Second harmonic generation Metrology", published as U.S. Publication No. 2015/0330908, which is incorporated herein by reference in its entirety. Other system and method options are presented in the portion of U.S. Provisional Application No. 61/980,860, filed on Apr. 17, 2014, titled "Wafer Metrology Technologies," referred to as Section II entitled "Charge Decay Measurement Systems and Methods," for example, as to intermediate optics, the inclusion of optical delay line(s) and optional electrode features, which is incorporated herein by reference in its entirety. See also U.S. patent application Ser. No. 14/690,256, filed Apr. 17, 2015 titled "Charge Decay Measurement Systems and Methods", published as U.S. Publication No. 2015/0331029, which is incorporated herein by reference in its entirety.

As shown, system 3000 includes a primary or probe laser 3010 for directing an interrogation beam 3012 of electromagnetic radiation at a sample wafer 3020, which is held by a vacuum chuck 3030. As illustrated in FIG. 1B, the chuck 3030 includes or is set on x- and y-stages and optionally also a rotational stage for positioning a sample site 3022 across the wafer relative to where the laser(s) are aimed. The x-y stage enables scanning multiple wafer surface sites or locations 3022 without movement of other hardware. A rotational stage optionally enables assessing crystal structure effects on SHG. Further optional features, aspects and/or uses of chuck 3030 are presented elsewhere in this application entitled. The sample site 3022 can include one or more layers. The sample site 3022 can comprise a composite substrate including at least two layers. The sample site 3022 can include an interface between two dissimilar materials (e.g., between two different semiconductor materials, between two differently doped semiconductor materials, between a semiconductor and an oxide, between a semiconductor and a dielectric material, between a semiconductor and a metal or an oxide and a metal).

When system 3000 is in use, a beam 3014 of reflected radiation directed at a detector 3040 will include an SHG signal. The detector 3040 may be any of a photomultiplier tube, a CCD camera, an avalanche detector, a photodiode detector, a streak camera and a silicon detector. System 3000 may also include one or more shutter-type devices 3050. The type of shutter hardware used will depend on the timeframe over which the laser radiation is to be blocked, dumped or otherwise directed away from the sample site 3022. An electro-optic blocking device such as a Pockel's Cell or Kerr Cell can be used to obtain very short blocking periods (i.e., with actuation times on the order of 10-9 to 10-12 seconds).

For longer blocking time intervals (e.g., from about 10-5 seconds and upwards) mechanical shutters or flywheel chopper type devices may be employed. However, electro-optic blocking devices will allow a wider range of materials to be tested in accordance with the methods below. A photon counting system 3044 capable of discretely gating very small time intervals, typically, on the order of picoseconds to microseconds can be employed to resolve the time-dependent signal counts. For faster-yet time frames optical delay line(s) may be incorporated as noted above.

System 3000 can include an additional electromagnetic radiation source 3060 also referred to as a pump source. In various implementations, the radiation source 3060 can be a laser illustrated as emitting a directed beam 3062 or a UV flash lamp emitting a diverging or optically collimated pulse 3064. In the case of a laser source, its beam 3062 may be collinear with beam 3012 (e.g., as directed by additional mirrors or prisms, etc.) Source 3060 output wavelengths of light may be anywhere from about 80 nm and about 1000 nm. Using shorter wavelengths in this range (e.g. less than about 450 nm), is possible to drive charge excitation using fewer photons and/or with lower peak intensities than at longer wavelengths.

For a flash lamp, energy per flash or power level during flash may be substrate material dependent. A flashlamp producing a total energy of 1 J to 10 kJ per flash would be appropriate for fully depleted silicon-on-insulator (FD-SOI).

However a pulsed or constant UV source would be viable as well. The important factor in the pump characteristics and use is that charge carriers are injected into the dielectric of the material to be interrogated. Manufacturers of suitable flash lamps include Hellma USA, Inc. and Hamamatsu Photonics K.K.

When a laser is employed as source 3060, it may be any of a nanosecond, picosecond or femtosecond or faster pulse laser source. It may even be a continuous solid-state laser. In various embodiments, the pump source is tunable in wavelength. Commercially available options regarding lasers which are tunable include Spectra Physics' Velocity and Vortex Tunable Lasers. Additional tunable solid state solutions are available from LOTIS Ltd.'s LT-22xx series of solid state lasers.

Whether provided as a laser or a flash lamp, pump source 3060 can be selected for relatively high average power. This could be from about 10 mW to about 10 W, but more typically from about 100 mW to about 4 W, depending on material to be interrogated (as, again, the consideration is ensuring that charge carrier mobility is induced in a way such that charge carriers are injected into the interface of the material (e.g., the dielectric interface), which can be material specific. The average power of the pump source 3060 is selected to be below the optical damage threshold of the material. For example, pump source 3060 can be selected to have an average optical power between 1-2 W when the interrogating material comprises silicon so as to not exceed the optical damage threshold for silicon.

Probe laser 3010 may be any of a nanosecond, picosecond or femtosecond or faster pulse laser source. Two options are currently commercially available regarding lasers have the peak power, wavelength and reliability needed are doped fiber and Ti:Sapphire units. Coherent's VITESSE and Spectra Physics' MAI TAI lasers are examples of suitable Ti:Sapphire devices. Femtolasers Gmbh and others manufacture also manufacture other relevant Ti:Sapphire devices. Suitable doped fiber lasers are produced by IMRA, OneFive, and Toptica Photonics. Pico- and/or nano-second lasers from many manufacturers, such as Hamamatsu, may be options as well depending on the substrate material and pump type. Laser 3010 may operate in a wavelength range between about 100 nm to about 2000 nm with a peak power between about 10 kW and 1 GW, but delivering power at an average below about 150 mW.

Various other optional so-called "intermediate" optical components may be employed in system 3000. For example, the system 3000 may include a dichroic reflective or refractive filter 3070 for selectively passing the SHG signal coaxial with reflected radiation directly from laser 3010 and/or source 3060. Alternatively, a prism may be employed to differentiate the weaker SHG signal from the many-orders-of-magnitude-stronger reflected primary beam. However, as the prism approach has proved to be very sensitive to misalignment, a dichroic system as referenced above may be preferred. Other options include the use of diffraction grating or a Pellicle beam splitter. An optical bundle 3080 for focusing and collimating/columniation optics may be provided. Alternatively, a filter wheel 3090, polarizer(s) 3092 and/or zoom len(s) 3094 units or assemblies may be employed in the system. Also, an angular (or arc-type) rotational adjustment (with corresponding adjustment for the detector) and in-line optical components may be desirable.

The output from the detector 3040 and/or the photon counting system 3044 can be input to an electronic device, electronics, processing electronics, control electronics, or processing/control electronica 3048. The electronic device 3048 can be a computing device, a computer, a tablet, a microcontroller or a FPGA. The electronic device 3048 includes a processor, processing electronics, control electronics, processing/control electronics or electronics that may be configured to execute one or more software modules. In addition to executing an operating system, the processor, processing electronics, control electronics, processing/control electronics, or electronics may be configured to execute one or more software applications, including a web browser, a telephone application, an email program, or any other software application. The electronic device 3048 can implement the methods discussed herein by executing instructions included in a machine-readable non-transitory storage medium, such as a RAM, ROM, EEPROM, etc. The electronic device 3048 can include a display device and/or a graphic user interface to interact with a user. The electronic device 3048 can communicate with one or more devices over a network interface. The network interface can include transmitters, receivers and/or transceivers that can communicate such as, for example, wired Ethernet, Bluetooth®, or wireless connections.

Regarding other options, since an SHG signal is weak compared to the reflected beam that produces it, it is desirable to improve the signal-to-noise ratio of SHG counts. As photon counting gate times for the photon counting system 3044 decrease for the blocking and/or delay processes described herein, improvement becomes even more important. One method of reducing noise that may be employed is to actively cool the photon counter. This can be done using cryogenic fluids such as liquid nitrogen or helium or solid state cooling through use of a Peltier device. Others areas of improvement may include use of a Marx Bank Circuit (MBC) as relevant to shutter speed. Moreover, system 3000 may be incorporated in-line within a production line environment. Production line elements preceding or following system 100 may include any of epitaxial growth system, lithography and/or deposition (CVD, PVD, sputtering, etc.) systems.

Figure 2A:
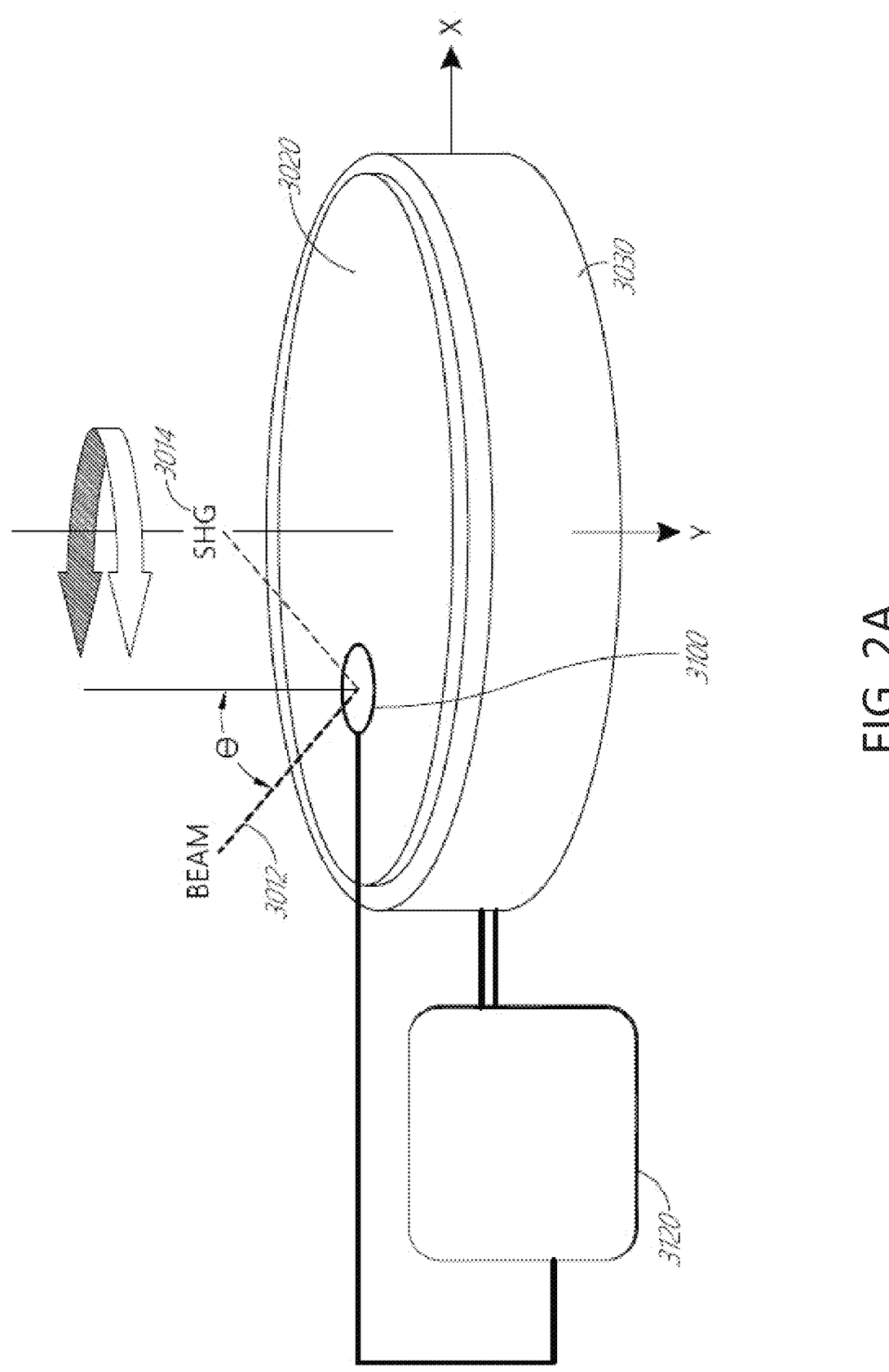
FIG. 2A is a perspective view of a first chuck configuration hereof.
Figure 2B:
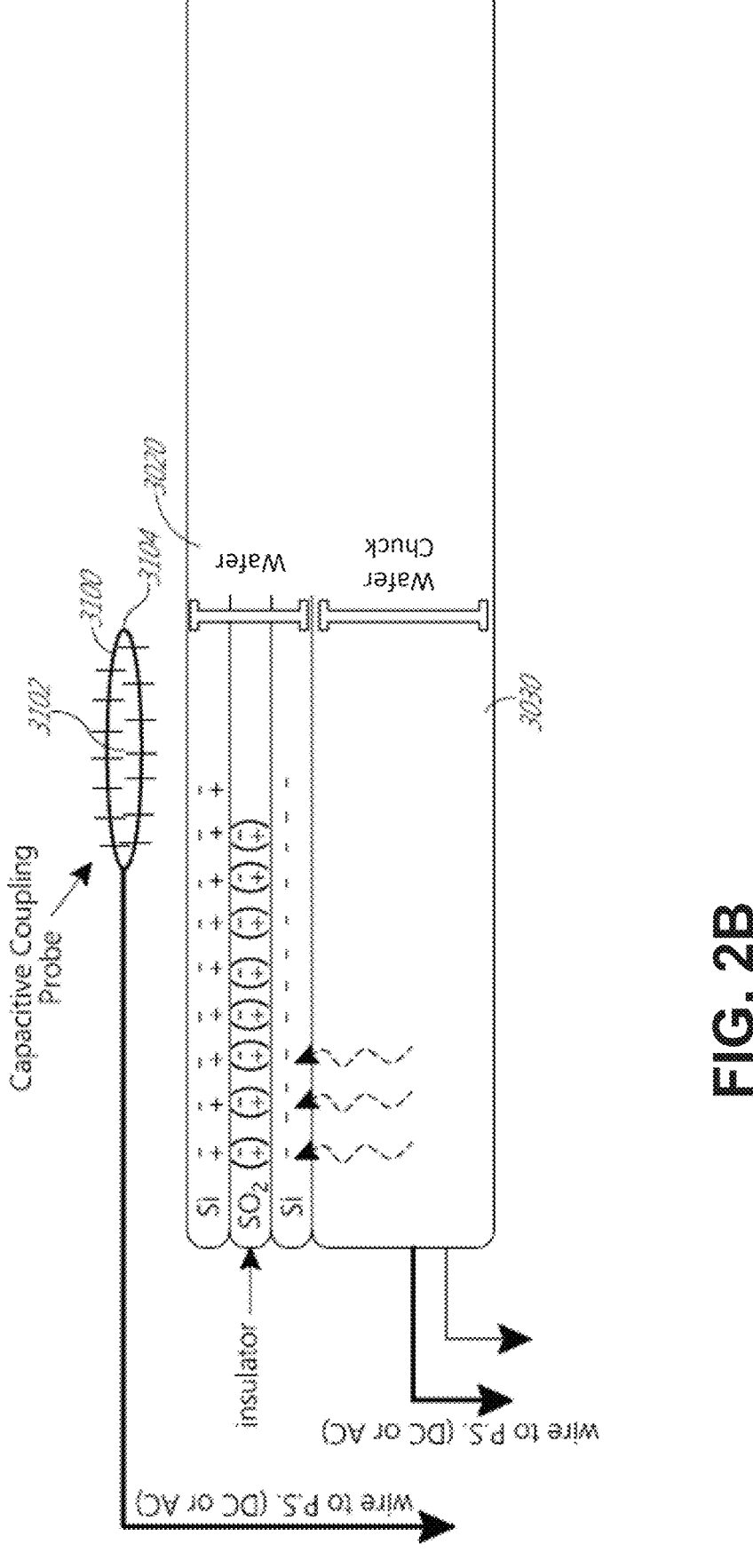
FIG. 2B is a side-sectional view of the chuck configuration in FIG. 2A.

In any case, FIGS. 2A and 2B provide views of a first set of purpose-specific chuck hardware that may be employed in the subject SHG system. The chuck 3030 holds a wafer 3020 by vacuum thereto or other means. The chuck 3030 is conductive and connected to a power supply. Optionally, a capacitive coupling probe 3100 is also connected to the power supply 3120. The power supply may be computer controlled, or at least its output is coordinated by computer for timing reasons as summarized above. The probe 3100 may likewise be controlled and/or monitored. It will be controlled in the sense that it will be part of a capacitive circuit attached to the power supply 3120. It may be monitored along with the chuck 3030 by a voltmeter to ensure that voltage is being induced as intended.

The probe 3100 includes a hole 3102 or port (e.g., 0.2 mm in diameter) in its ring 3104 to allow the optical beams 3012, 3014 (interrogation beam(s) and reflected SHG beam) to pass unblocked, and is fixed relative to the optics so that it moves or stays with the optical elements to remain centered on the (re)positioned sample site 3022 as the device surface is scanned. The coupling (indicated as having a positive "+" charge) is positioned close to the sample device surface (e.g., within about 1 mm to about 2 mm) but does not touch. It is supported by a cantilever arm or otherwise. The probe 3100 may be provided as a ring 3104 as shown in FIG. 2B, or it may comprise a larger disc or plate.

With the example shown in cross section in FIG. 2B, a wafer 3020 or device surface (comprising silicon) is separated from a silicon bulk layer by SiO2 insulator. Thus, as explained above, the need for inductive bias to the device surface because it is otherwise (at least substantially) electrically insulated or isolated from the underlying silicon in contact with the conductive chuck 3030.

Figures 3A, 3B, 3C:
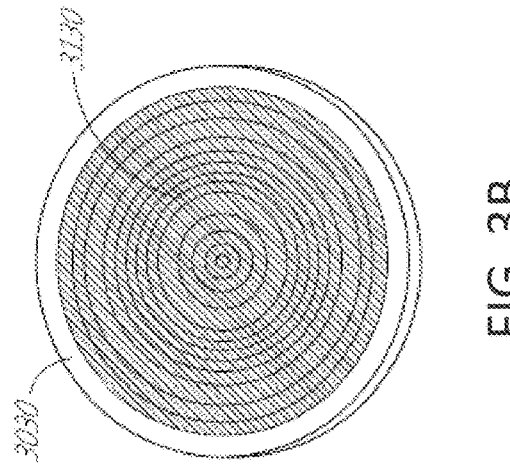
FIGS. 3A and 3B are partial cutaway, perspective views of a second chuck configuration hereof.
FIG. 3C is cutaway top view of the chuck in FIG. 3A/3B.

FIGS. 3A-3C detail an electromagnetic chuck 3030 that includes electrical coil(s) 3130 connected to a power supply 3120. In use, the wafer 3020 sits and is secured on top of the chuck 3030. When an alternating current (AC) is applied to the coil(s) 3130, this generates an alternating magnetic field through the wafer 3020. The magnetic field induces an electric potential across the wafer 3020 including its device surface. This electric field then enables the various modes of SHG interrogation noted above, some of which are detailed below. Alternatively, DC current may be applied to the coils 3130 which are oriented parallel to the chuck 3030, creating a constant magnetic field across the chuck for other effects as described above.

Figure 4A:
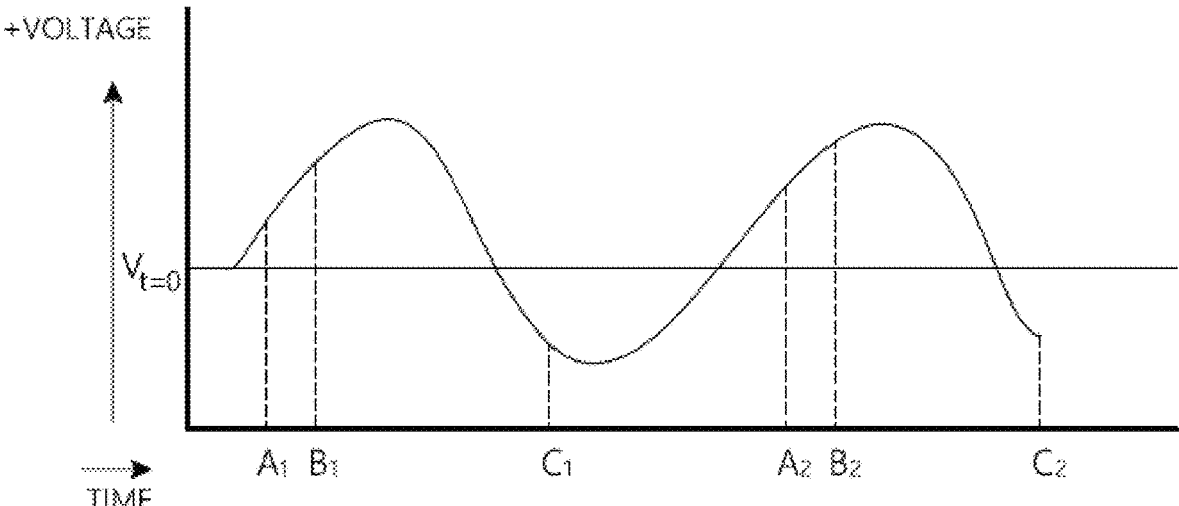
FIGS. 4A and 4B relate to AC voltage applied to and exhibited in a sample for DC bias probe elimination.
Figure 4B:
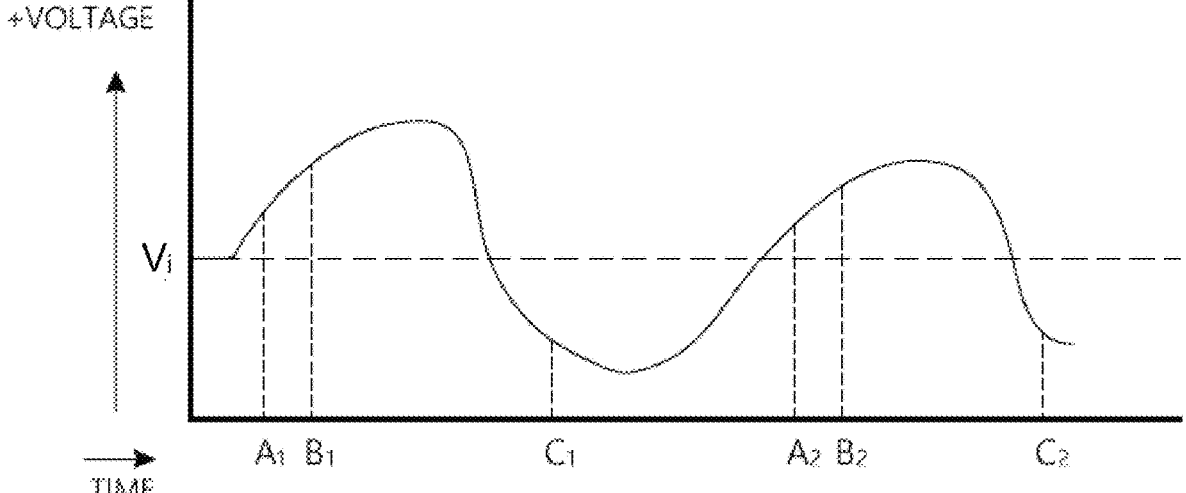
Figure 5A:
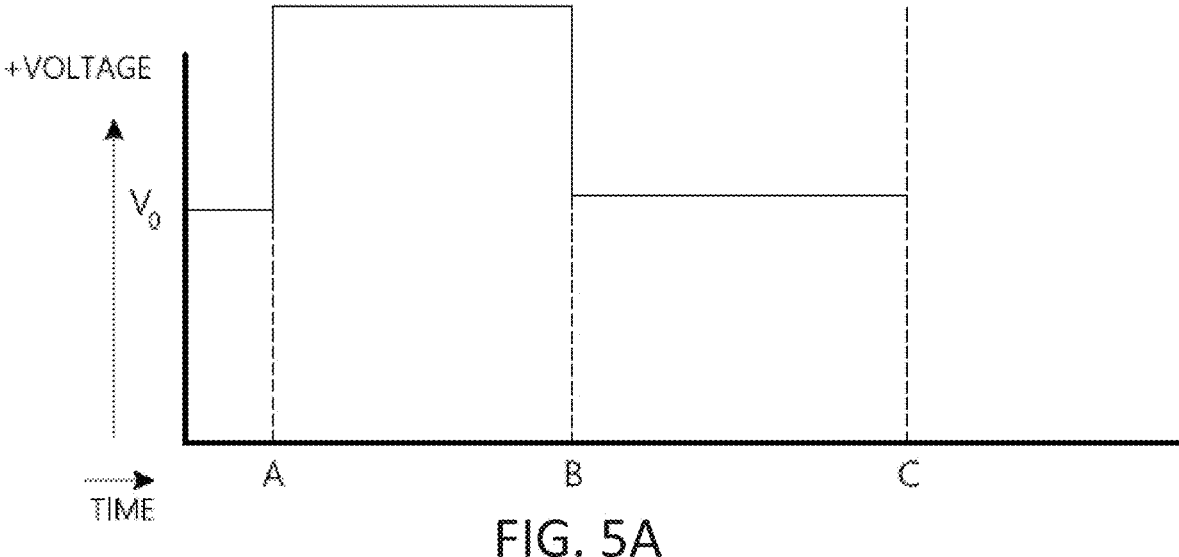
FIGS. 5A and 5B relate to AC voltage applied to and exhibited in a sample for testing leakage current.
Figure 5B:
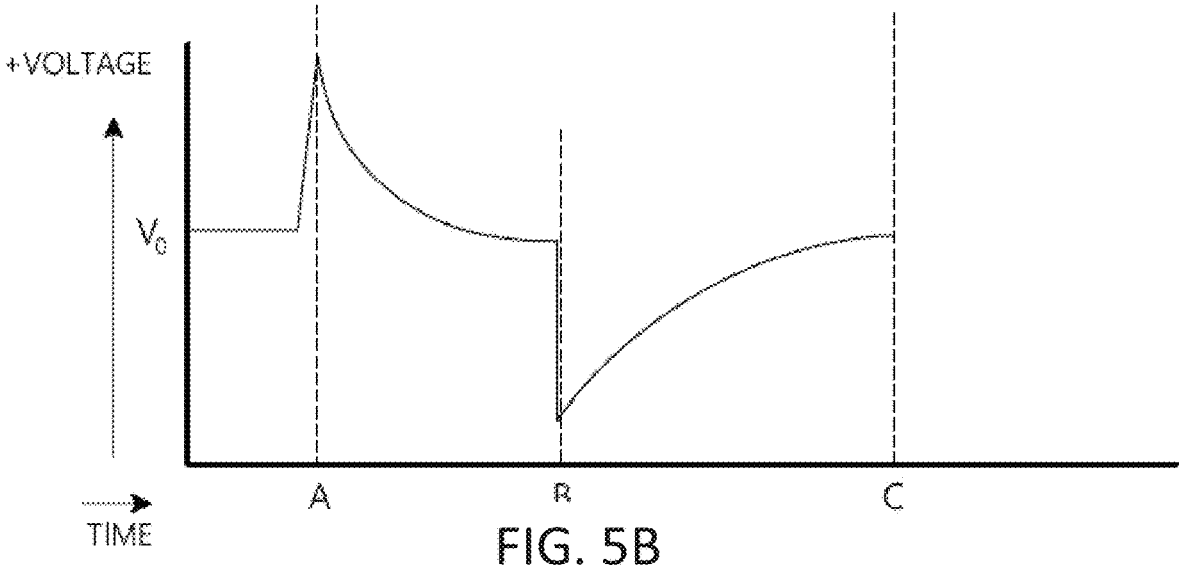

FIG. 4A shows an example AC voltage (V) profile (sinusoidal wave) applied to the substrate bulk layer over time. FIG. 4B shows a hypothetical response for induced voltage between the device and bulk layers (Vi) of the substrate on which the device is fabricated. In various embodiments, the substrate can comprise the silicon wafer or a portion of a semiconductor material. FIG. 5A shows an example AC voltage (Vo) profile (square wave) applied to the substrate bulk layer over time. FIG. 5B shows a hypothetical response for induced voltage between the device and bulk layers (Vi). Notably, the voltage input in either of FIG. 4A or 5A may differ from that shown, and could potentially be applied in steps, ramps, sine waves, or other forms.

More specifically regarding FIGS. 4A and 4B, as alluded to above, in order to minimize noise and obtain statistically relevant indicator(s) of SHG intensity as a function of voltage across the interfaces, multiple photon counting windows may be desirable. For such purposes, example points A1 and A2 are timed so that the voltage between the bulk and device layers, voltage A, is the same for both points. This is true for example points B1 and B2 at voltage B, and example points C1 and C2 at voltage C. Using voltage A as an example, SHG is recorded, and counts at points A1 can be summed with counts at point A2 and further at A3, A4, An . . . in an arbitrarily long series depending on the desired measurement time. The total number of counts measured in this period is then divided by the time over which this "gate" spans as a way of finding the average number of counts per second, so that SHG intensity can be plotted as a function of bulk-device voltage A. The same method can be used to obtain measurements for voltage B at points B1 and B2 as well as at B3, B4, Bn . . . in an arbitrarily long series depending on the desired measurement time. The total number of counts measured in this period is then divided by the time over which this "gate" spans as a way of finding the average number of counts per second, so that SHG intensity can be plotted as a function of bulk-device voltage B. Likewise, this method can be used to obtain measurements for voltage C at points C1 and C2 as well as at C3, C4, Cn . . . in an arbitrarily long series depending on the desired measurement time. The total number of counts measured in this period is then divided by the time over which this "gate" spans as a way of finding the average number of counts per second, so that SHG intensity can be plotted as a function of bulk-device voltage C. Further details regarding the utility of SHG intensity as a function of bias voltage can be found in the DC biasing literature, an example of which is, "Charge Trapping in Irradiated SOI Wafers Measured by Second Harmonic Generation," IEEE Transactions on Nuclear Science, Vol. 51, No. 6. December 2004 and "Optical probing of a silicon integrated circuit using electric-field-induced second-harmonic generation," Applied Physics Letters 88, 114107, (2006), each of which publication is incorporated herein by reference in its entirety.

More specifically regarding FIGS. 5A and 5B, these figures illustrate an example for interrogating a Silicon-On-Insulator (SOI) device. In this example, a conductive chuck begins at a 'neutral' ground state, and bulk and device layers being at an equilibrium potential. At moment 'A', voltage applied to the chuck is changed rapidly, applying that voltage to the sample's conductive bulk layer. Since the sample's device layer is separated from the bulk by a thin buried oxide layer and not directly connected with a conductor, an electric potential field, or voltage will be induced between the device and bulk layers. Between times 'A' and 'B', the voltage applied to the chuck is not changed. Since the dielectric between the bulk and device layers is not perfect, the induced potential will drive a leakage current between the layers, causing the potential between the bulk and device layers to return to its natural state. This spike and decay in electric field is then monitored via SHG to provide insight to the leakage current. At time 'B' the voltage applied to the chuck is returned to ground, causing the voltage across the interface to reverse.

The systems and methods described herein can be used to characterize a sample (e.g., a semiconductor wafer or a portion thereof). For example, the systems and methods described herein can be used to detect defects or contaminants in the sample as discussed above. The systems and methods described herein can be configured to characterize the sample during fabrication or production of the semiconductor wafer. Thus, the systems and methods can be used along a semiconductor fabrication line in a semiconductor fabrication facility. The systems and methods described herein can be integrated with the semiconductor fabrication/production line. The systems and methods described herein can be integrated into a semiconductor fab line with automated wafer handling capabilities. For example, the system can be equipped with an attached Equipment Front End Module (EFEM), which accepts wafer cassettes such as a Front Opening Unified Pod (FOUP). Each of these cassettes can be delivered to the machine by human operators or by automated cassette-handling robots which move cassettes from process to process along fabrication/production line.

In various embodiments, the system can be configured such that once the cassettes are mounted on the EFEM, the FOUP is opened, and a robotic arm selects individual wafers from the FOUP and moves them through an automatically actuated door included in the system, into a light-tight process box, and onto a bias-capable vacuum chuck. The chuck may be designed to fit complementary with the robotic arm so that it may lay the sample on top. At some point in this process, the wafer can be held over a scanner for identification of its unique laser mark.

Accordingly, a system configured to be integrated in a semiconductor fabrication/assembly line can have automated wafer handling capability from the FOUP or other type of cassette; integration with an EFEM as discussed above, a chuck designed in a way to be compatible with robotic handling, automated light-tight doors which open and close to allow movement of the robotic wand/arm and software signaling to EFEM for wafer loading/unloading and wafer identification.

Corona Charging

Apparatus for optical second harmonic generation detection under corona charging is also described herein. The subject hardware comprises an SHG apparatus with a corona discharge source (e.g., corona gun) for delivering or depositing one or more charges Q to a sample. The sample can comprise a semiconductor material. For example, the sample can comprise a semiconductor device, a semiconductor wafer, a semiconductor chip, a bulk semiconductor material, a heterojunction, etc. An external voltage source is connected between the sample and the corona discharge source to deliver or deposit one or more charges Q on the sample. The deposited charges can result in creating a voltage bias between the front surface and the back surface of the sample. It is noted that in various implementations only one side (e.g., the backside) of the sample is connected to the external voltage source to create a potential difference between the front surface and the back surface of the sample. Accordingly, in contrast to testing methods that rely on introducing current or charges in the sample by electrically contacting both surfaces of the sample, the corona discharge source can introduce charges without contacting both sides of the sample but electrically contacting only one side of the sample. This can be advantageous in reducing the risk of damaging one side (e.g., the front side of the sample) during testing.

Figure 6A:
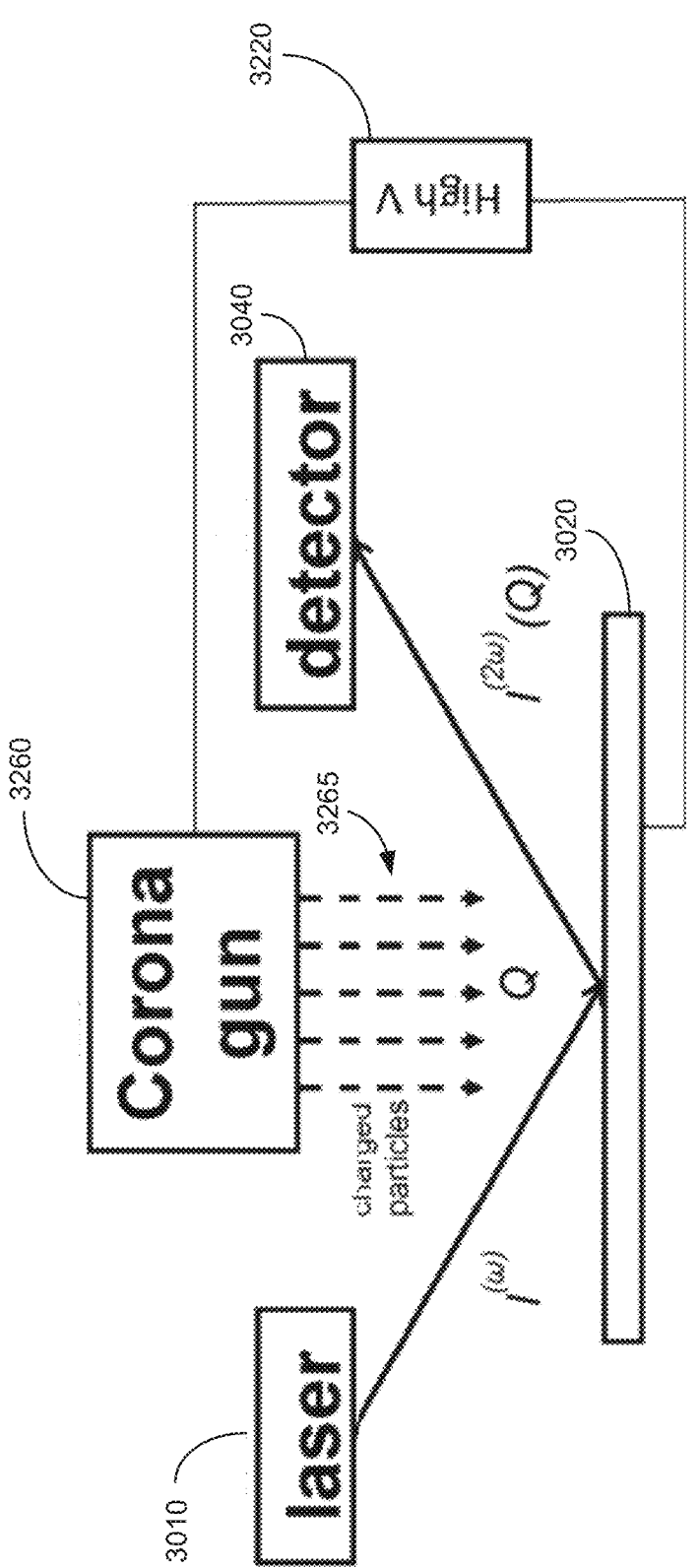
FIGS. 6A, 6B and 6C are schematic diagrams of SHG systems using a corona discharge source.
Figure 6B:
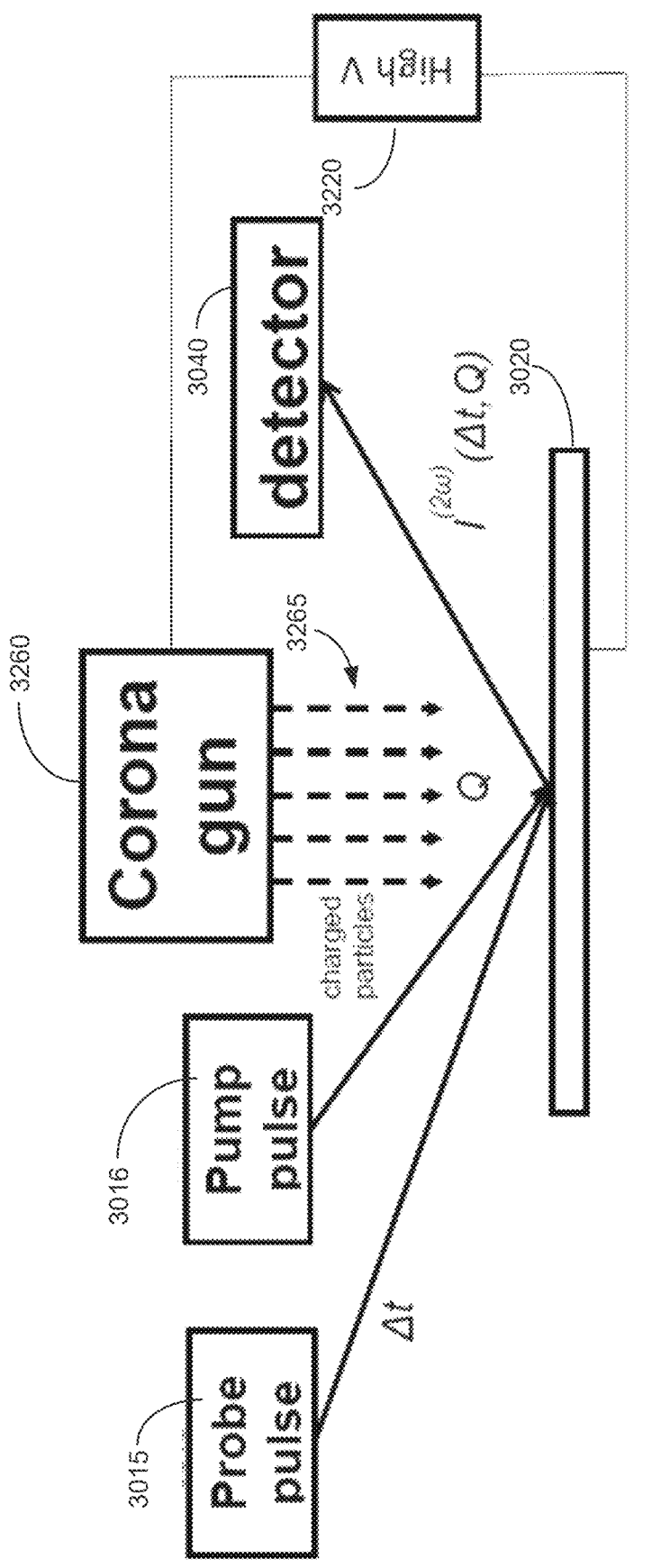

As illustrated in FIGS. 6A and 6B, a second harmonic generation signal, $I_{2\omega}(Q)$, from a sample 3030 is detected while exposing the surface of the sample to a corona discharge 3265 from a corona discharge source (e.g., corona gun) 3260. The parameter co is the optical frequency of incident probe light from a laser 3010 and Q is the charge from the corona gun 3260 received by the sample. The corona gun or source of corona discharge 3260 is disposed with respect to the sample 3030 (e.g., sample surface) such that the sample (or sample surface) receives current, for example, in the form of charged particles (Q) such as charged ions from the corona gun. The corona gun or source 3260 of corona discharge 3265 may comprise, for example, an emitter comprising a conductor to which can be applied a voltage. As illustrated, for example, a voltage supply 3220 is electrically connected to the corona gun 3260 (e.g., emitter) and the sample 3030 to apply a voltage therebetween. The sample 3030 can be disposed on a chuck (e.g., chuck 3030) and the bias from the voltage source can be supplied through the chuck. The emitter may comprise an elongate conducting probe that has a narrow end relative to the length thereof. The narrow end may be sharp and thereby increase a potential gradient created by the voltage applied to the probe. Without subscribing to any particular scientific theory, an electric field associated with the potential gradient may accelerate charged particles such as ions from ionized gas (e.g. air) proximal to the probe toward the sample 3030 (e.g., sample surface 3020). In various embodiments, the charged particles can comprise positive or negative ions generated in the atmospheric air surrounding the sample 3030. For example, depending on the value of the voltage provided by the voltage supply 3220, the charged particles can comprise $(H_2O)^+_n$ and/or $(CO_2)^-$ ions. These charged particles may collide with other atoms creating more ions and charged particles, which also may be accelerated by the electric field toward the sample 3030. More collisions may result in the creation of more ions that are also directed to the sample by the voltage gradient. As a result, a plurality of charged particles may be incident on the sample 3030 and/or sample surface 3020.

In some implementations, the corona discharge can be applied to the sample and a second harmonic generation signal from the surface can be measured. For example, in some implementations, surface band bending at the sample surface is modified by deposited charges (Q) from corona gun 3260. SHG signal $(I(2\omega))$ induced by pulse laser illumination $(I(\omega))$ can be used to detect the interfacial charging states at the corresponding band bending.

In some implementations, for example, by depositing charged particles on the sample, a voltage bias is applied to the sample to change surface potential. The interfacial electrical properties of the sample 3030 can be simultaneously and/or subsequently characterized by SHG by directing light from the laser 3010 onto the sample surface 3020. FIG. 6A illustrated an example of SHG detection using a corona discharge source that can introduce or deposit one or more charges on the sample 3030. Other configurations are possible. In some implementations, the charges introduced or delivered by the corona discharge source can enable surface band bending to be modulated through an increased range (e.g., entire range) of band gap states at the interfaces of the semiconductor material. For crystals with inversion symmetry, SHG signal is dominated by interfacial dipole contribution, which gives the intrinsic sensitivity to interfacial electric properties of semiconductor materials. Thus, SHG can be an effective tool to measure interfacial electrical properties. Combining SHG with corona discharge, can increase the usefulness of such SHG measurements. Additionally introducing or delivering charges via a corona discharge source is a non-contact approach that does not damage the sample. An accurate non-contact and holistic characterization of the interfacial electric properties can thus be provided by the combination of SHG and corona discharge.

One or more techniques and/or configurations discussed above can be applied in certain implementations in approaches and/or configurations where corona discharge is utilized. For example, as described above, a transient electric field produced by the charged particles on the surface of the semiconductor material induces an electric field in the sample 3030 which can change a characteristic (e.g., intensity or frequency) of the SHG signal.

As discussed above, an advantage of this corona biasing is that voltage biased SHG measurements can be obtained without using contact voltage bias probes on the front surface of the wafer.

FIGS. 6A and 6B show different methods and configurations for obtaining SHG. In the implementation shown in FIG. 6A, a light source (e.g., a laser) is employed as optical probing of quasi-static interfacial electric field induced by corona charge. In contrast, in FIG. 6B, separate optical pump and probe sources are used to detect ultrafast charging dynamics under different biasing conditions. FIG. 6A, for example, shows the corona gun 3260 placed above the sample 3020, which may be a wafer. FIG. 6A also shows the high voltage power supply 3220 electrically coupled to corona gun 3260 and the chuck 3030 that supports the wafer. The voltage power supply supplies a bias voltage between the corona gun 3260 and the wafer 3020 in order to deliver the charge particles to wafer surface. FIG. 6A schematically illustrates the laser 3010 outputting a laser beam that is directed onto the sample 3020. FIG. 6A also shows a detector 3040 disposed to receive light from the wafer 3020. The laser beam from the laser 3010 can induce a SHG signal which is sensed by the detector 3040. The induced SHG signal can have a wavelength less than about 10 microns. For example, the induced SHG signal can have a wavelength between about 200 nm and about 400 nm, between about 400 nm and about 450 nm, between about 450 nm and about 750 nm, between about 750 nm and about 980 nm, between about 980 nm and about 1.3 microns, between about 1.1 microns and about 1.6 microns, between about 1.5 microns and about 3 microns, between about 3 microns and about 8.8 microns, or any value in a range/sub-range defined by any of these values. In various implementations, the induced SHG signal can be in an ultraviolet, visible, near infrared or far infrared wavelength range. When a corona discharge is applied to the surface of the sample 3030, charged particles are deposited on the sample 3030. In various implementations, the charged particles induce an electric potential across the sample 3030 including device surface(s). This electric field can then enable the various modes of SHG interrogation.

In FIG. 6B, in place of a single laser 3010, separate pump and probe sources 3016, 3015 are used to direct pump light and a probe beam, respectively, onto the surface of the wafer 3020 to induce SHG. A SHG signal from the sample having a frequency (2ω) that is twice the frequency (ω) of the probe beam 3015 can be detected by the detector 3040. Time-resolved SHG effect signals induced by the combination of pump light (e.g., pump pulses) from the pump source 3016 and probe light (e.g., probe pulses) from the probe source (e.g., laser) 3015 can be used to detect carrier dynamics near the semiconductor surface by varying a delay time (Δt) between the pump light and probe light (e.g., probe pulse and pump pulses). As described above, surface band bending is modified by deposited charges (Q) from the corona gun or corona discharge source 3260. The carrier dynamics at a corresponding band bending state can in various implementations discussed herein, for example, be extracted as a function of surface charges. These and other time delay techniques are described above as well as in U.S. patent application Ser. No. 14/690,256, filed Apr. 17, 2015 titled "Charge Decay Measurement Systems and Methods", published as U.S. Publication No. 2015/0331029, which is incorporated herein by reference in its entirety. Any combination of techniques disclosed above and/or in this incorporated by referenced patent applications may be used in conjunction with configurations and/or techniques described herein such as those employing corona discharge.

Figure 6C:
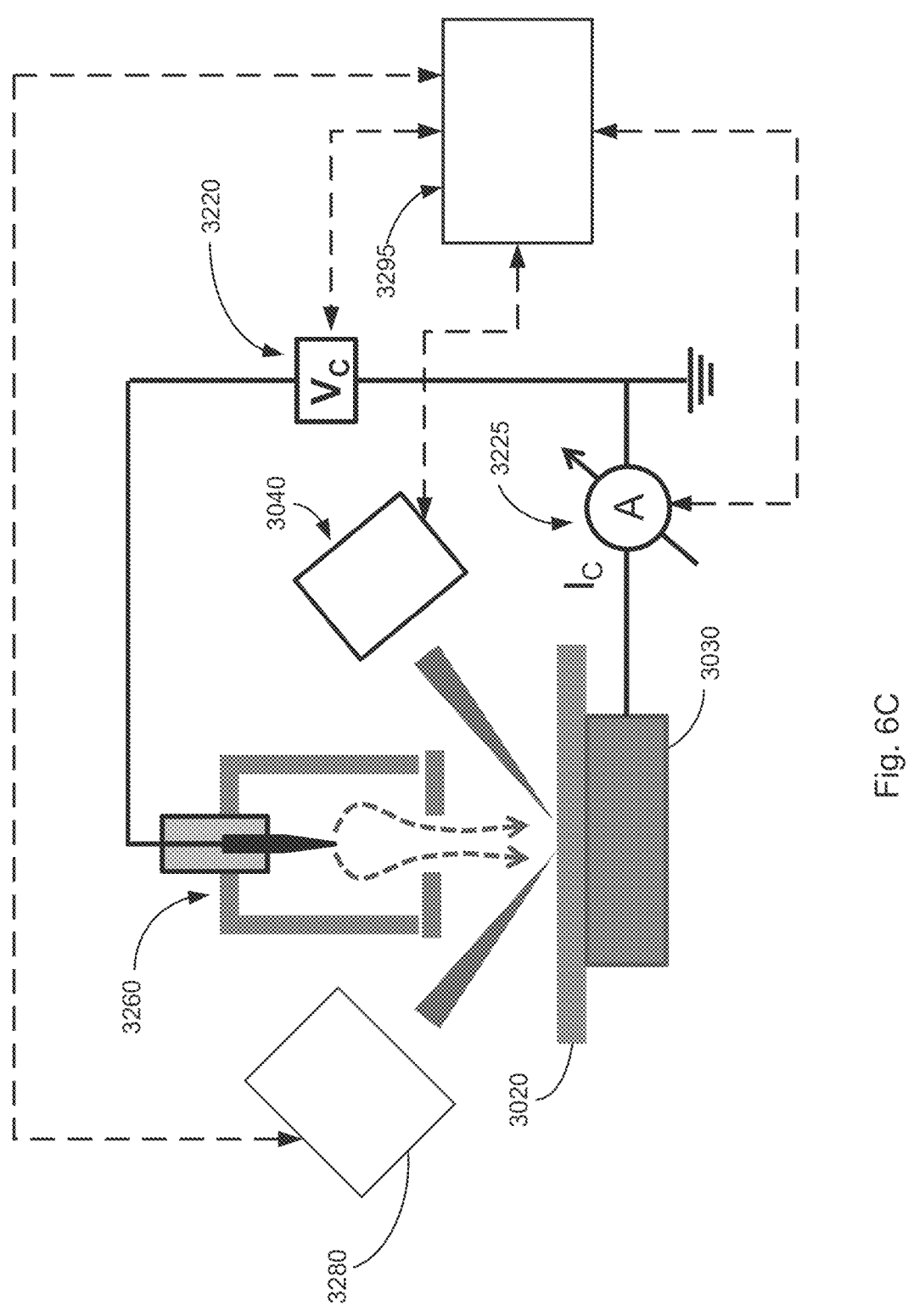

The amount of charge deposited on the surface of a sample by the corona discharge source 3260 can be determined in various embodiments of the systems configured to detect SHG signal from the surface of a sample that is exposed to a corona discharge 3265, such as, for example, the implementations described above with reference to FIGS. 6A and 6B. FIG. 6C shows an example implementation of a SHG metrology system that is configured to detect SHG signal from the surface of a sample 3020 on which charges are deposited using a corona discharge source 3260. In the implementation depicted in FIG. 6C, optical radiation from an optical source 3280 is incident on the surface of the sample 3020 and second harmonic generated signal is detected by a detector 3040. The optical source 3280 can comprise a laser 3010 that emits radiation at a frequency ω as discussed above with reference to FIG. 6A or a separate pump and probe source 3016 and 3015 respectively as discussed above with reference to FIG. 6B.

The amount of charge deposited on the surface of the sample 3020 by the corona discharge 3265 from the corona discharge source 3260 can be determined by monitoring a current (e.g., DC current) induced by the charges deposited on the surface of the sample 3020. The current induced by the charges deposited on the surface of the sample 3020 can be measured using an electrical sensor such as an electrical meter 3225 (e.g., one or more current sensors, current meters, ammeters, or voltage sensors, voltmeters, electrometers, etc.) disposed between the sample 3020 and an electrical ground as shown in FIG. 6C. For example, the electrical sensor or electrical meter 3225 can be electrically connected between an electrical ground and the bottom surface of the sample 3020 as shown in FIG. 6C. The amount of charge deposited on the surface of the sample 3020 by the corona discharge from the corona discharge source 3260 in a time interval t can be proportional to the measured current between the sample 3020 and the electrical ground. For example, the amount of charge deposited on the surface of the sample 3020 in a time interval t can be equal to the measured current between the sample 3020 and the electrical ground and given by equation (1) below:

$$Q_c = \int_0^t I_c dt, \tag{1}$$

where $I_c$ is the measured current.

An electronic processor, processing electronics, control electronics, processing/control electronics or electronics 3295 can be configured to execute programmable instructions to determine the amount of charge deposited on the surface of the sample 3020 by the corona discharge from the corona discharge source 3260 based on an output provided by the electrical meter 3225 dependent on the current between the sample 3020 and the electrical ground. In some implementations, the electronic processor 3295 can be configured to obtain the output of the electrical meter 3225 dependent on the current between the sample 3020 and the electrical ground over a wired or a wireless network. In various implementations, the electronic processor 3295 can be further configured to control the voltage output from the voltage supply 3220. For example, the electronic processor 3295 can be configured to turn-off or change (e.g., decrease or increase) the voltage output from the voltage supply 3220 to the corona discharge source 3260. Changing the voltage output from the voltage supply 3220 to the corona discharge source 3260 can change the amount of charge that is deposited on the surface of the sample 3020 by the corona discharge 3265 from the corona discharge source 3260. Changing the voltage output from the voltage supply 3220 to the corona discharge source 3260 can change the type of charge (e.g., positive or negative charge) that is deposited on the surface of the sample 3020 by the corona discharge from the corona discharge source 3260.

In some implementations, the electronic processor 3295 can be configured to control the voltage supply 3220 such that the corona discharge from the corona discharge source 3260 are repeatedly turned on and turned off over multiple charging cycles. For example, the electronic processor 3295 can be configured to control the voltage supply 3220 to provide a voltage $V_{on}$ greater than a threshold voltage level for a period of time $t_{on}$ such that the corona discharge from the corona discharge source 3260 is on and provide a voltage $V_{off}$ less than the threshold voltage level for a period of time $t_{off}$ such that the corona discharge from the corona discharge source 3260 is off. In various embodiments, the time period $t_{on}$ and the voltage $V_{on}$ can be the same for different charging cycles such that the same amount of charges are deposited over the surface of the sample 3020 in the different charging cycles. In various embodiments, the time period $t_{on}$ and the voltage $V_{on}$ can be different for different charging cycles such that different amounts of charges are deposited over the surface of the sample 3020 in the different charging cycles. In some implementations, the chuck 3030 can be translated between different charging cycles such that charges are deposited on different portions of the surface of the sample 3020. These aspects are discussed in greater detail below.

In some implementations, in a first charging cycle the electronic processor 3295 can be configured to control the voltage supply 3220 to provide a first voltage $V_{on1}$ greater than a threshold voltage level for a first period of time $t_{on1}$ such that an amount of charge $Q_1$ is deposited on the surface of the sample 3020 during the first period of time $t_{on1}$, and provide a second voltage $V_{on2}$ greater than a threshold voltage level for a second period of time tong such that an amount of charge $Q_2$ is deposited on the surface of the sample 3020 during the second period of time $t_{on2}$. The polarity and the magnitude of charge deposited in the first period of time $t_{on1}$, and the second period of time $t_{on2}$ can be equal, in some implementations. In some implementations, the magnitude of charge deposited in the first period of time $t_{on1}$, and the second period of time $t_{on2}$ can be equal while the polarity of charge deposited in the first period of time $t_{on1}$, and the second period of time $t_{on2}$ can be reversed. In some implementations, the amount of charge $Q_1$ and $Q_2$ are deposited at the same location on the surface of the sample 3020. However, in some other implementations, the chuck 3030 can be translated between first period of time $t_{on1}$, and the second period of time $t_{on2}$ such that the charge $Q_1$ is deposited at a first location on the surface of the sample 3020 and the charge $Q_2$ is deposited at a second location on the surface of the sample 3020.

In various implementations, the electronic processor 3295 can be further configured to control and/or electronically communicate with the optical source 3280 and the detector 3040. The electronic processor 3295 can be in electronic communication with an electronic memory device. The electronic processor 3295 can be further configured to be in electronic communication with a display device. In various implementations, the electronic processor 3295 can be configured as a desktop computer, a laptop computer, a tablet, a mobile device or a smart phone or other types of boards and electronics.

Figure 6D:
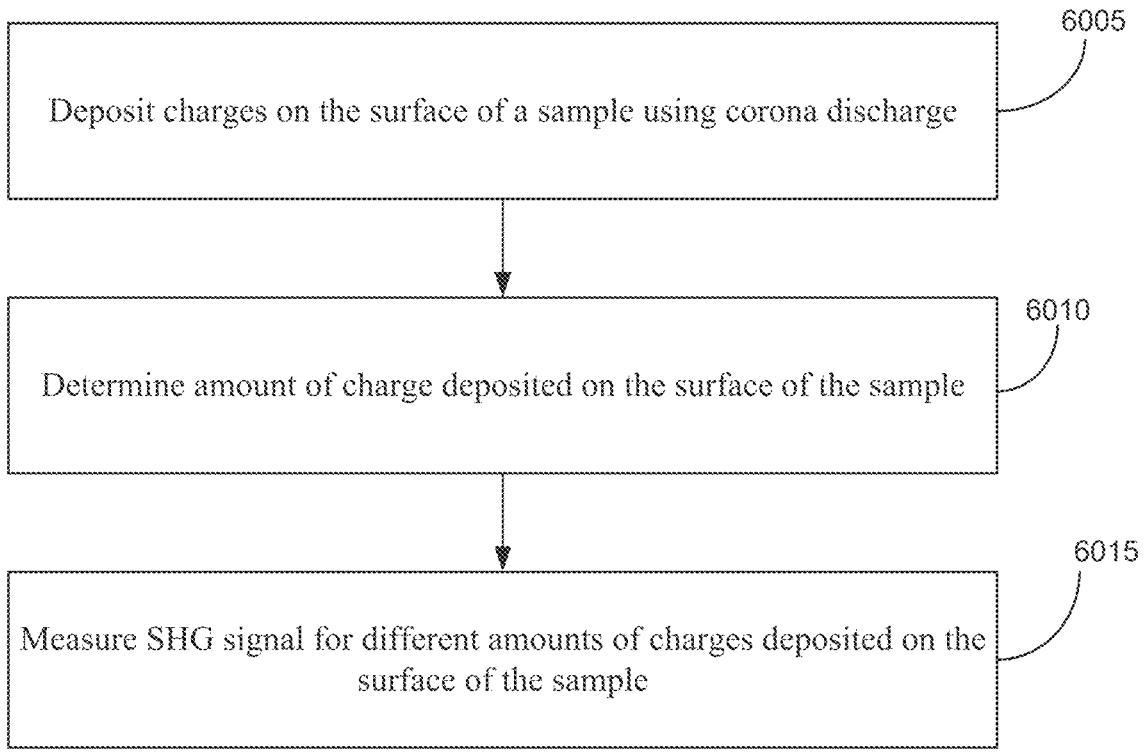
FIG. 6D is a flowchart illustrating a method of measuring SHG signal for different amounts of charges deposited on a surface of a sample.

FIG. 6D, is a flowchart illustrating a method of measuring SHG signal for different the amount of charges deposited on the surface of the sample 3020. As discussed above, an amount of charge is deposited on the surface of the sample 3020 using the corona discharge source 3260, as shown in block 6005. As discussed above, the deposited amount of charge can be determined from the current between the sample 3020 and the electrical ground as shown in block 6010. The SHG signal from the sample 3020 is measured for different amounts of charges deposited with the surface of the sample 3020, as shown in block 6015. The SHG signal is determined based on the output of the detector 3040 as discussed above. In some implementations, the SHG signal is obtained by irradiating the same location on the surface of the sample 3020 where the charges from the corona discharge source 3260 are deposited by light from a laser 3010 or pump and probe sources 3016 and 3015 respectively. In some implementations, the SHG signal is obtained by irradiating, by light from a laser 3010 or pump and probe sources 3016 and 3015, the same location on the surface of the sample 3020 where the charges from the corona discharge source 3260 are deposited. In some other implementations, the SHG signal is obtained by irradiating, with light from a laser 3010 or pump and probe sources 3016 and 3015, a location on the surface of the sample 3020 that is different from the location where the charges from the corona discharge source 3260 are deposited. The SHG signal from the sample can be measured simultaneously with the deposition of the charges from the corona discharge source 3260, in some implementations. In some implementations, the deposition of the charges from the corona discharge source 3260 can be stopped while measuring the SHG signal.

Figure 6E:
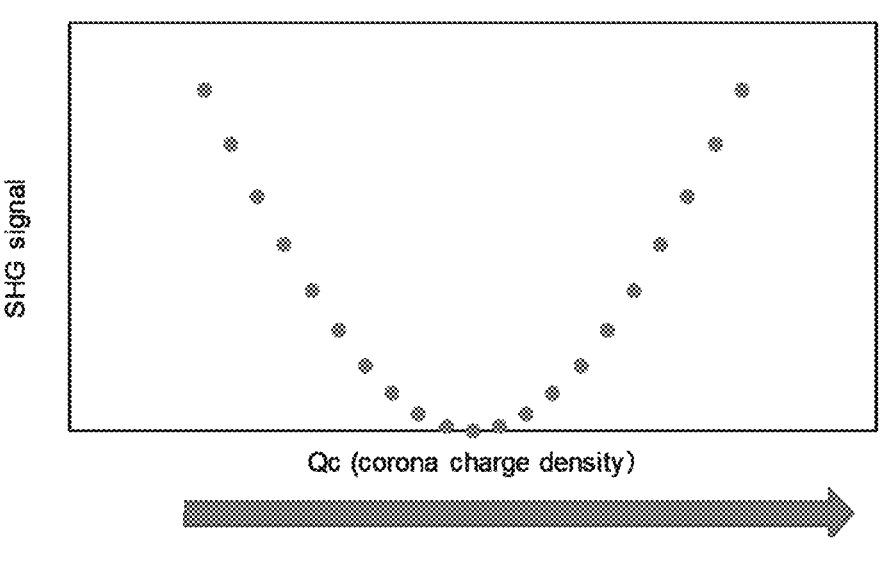
FIG. 6E schematically shows the variation of SHG signal for different amounts of charges deposited by a corona discharge source.

Depending on the material characteristics of the sample 3020, the variation of the SHG signal for different amounts of charge deposited by the corona discharge source 3260 on the surface of the sample 3020 can be non-linear. For example, in some implementations, the variation of the SHG signal for different amounts of charge deposited by the corona discharge source 3260 on the surface of the sample 3020 can be quadratic (or parabolic) as shown in FIG. 6E. The variation of the SHG signal for different amounts of charge deposited by the corona discharge source 3260 on the surface of the sample 3020 can provide information related to one or more defects (e.g., point defects) in the sample 3020. The variation of the SHG signal for different amounts of charge deposited by the corona discharge source 3260 on the surface of the sample 3020 can also provide information about interstitial states in the sample 3020. The variation of the SHG signal for different amounts of charge deposited by the corona discharge source 3260 on the surface of the sample 3020 can also provide information about region(s) of depletion, region(s) of accumulation (e.g., where the concentration of majority carriers is higher than doping concentration) and/or region(s) of inversion (e.g., where the concentration of minority carriers is higher than doping concentration) in the sample 3020. For example, in FIG. 6E, the portion of the curve corresponding to a decrease in SHG signal as the amount of charge deposited (or charge density) on the surface of the sample increases can provide information about the depletion region(s) of the sample 3020 and the portion of the curve corresponding to an increase in SHG signal as the amount of charge deposited (or charge density) on the surface of the sample increases can provide information about the accumulation region(s) of the sample 3020.

Figure 6F:
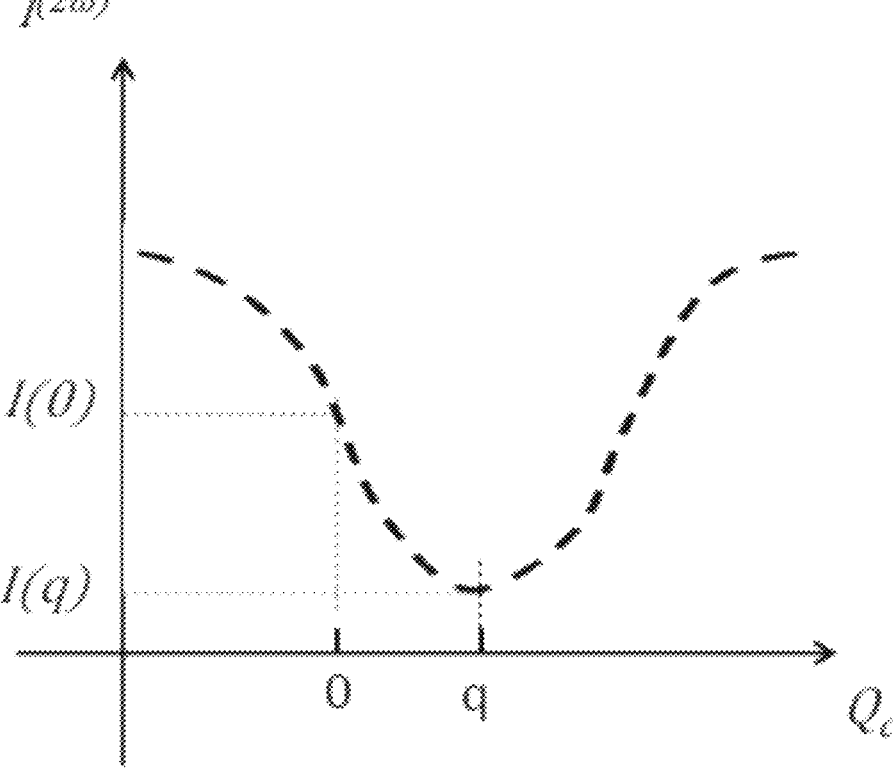
FIG. 6F is another schematic illustration of the variation of the intensity of SHG signal as the amount of charge deposited on the surface of the sample changes.

SHG metrology in the presence of corona charging can be used to determine charges in an oxide, such as, for example, an oxide layer of a semiconductor device. Particularly, the charge deposited on the surface of the sample can be used to measure oxide charges in an interfacial region between a metal and an oxide or a semiconductor and an oxide. FIG. 6F is another schematic illustration of the variation of intensity ($I^{(2\omega)}$) of the SHG signal with deposited charge ($Q_c$) on the surface of a sample (e.g., sample 3020). The variation of intensity ($I^{(2\omega)}$) of the SHG signal with deposited charge ($Q_c$) on the surface of a sample can be used to determine oxide charges in an interfacial region of a sample. In FIG. 6F, as charges deposited on the surface of the sample by the corona gun increases, the intensity of the SHG signal varies in accordance with the change in the electric field across the interfacial region. When the deposited charges compensates the oxide charges, the intensity of the SHG signal is reduced. When the deposited charges exactly compensates the oxide charges, the intensity of the SHG signal reaches a minimum value, which corresponds to the flat band condition. Accordingly, the oxide charge ($Q_{ox}$) is equal in magnitude to the deposited corona charge and has the opposite polarity (or sign) when the SHG reaches a minimum. The magnitude of the deposited corona charge in a time interval t can be determined from the current measured by the current meter 3225 using equation (1). As an example, in the curve shown in FIG. 6F, the oxide charge $(Q_{ox})$ is equal to $-q$, which corresponds to the corona charge for which the intensity ($I^{(2\omega)}$) of the SHG signal has a minimum value ($I(q)$).

Accordingly, a non-contact apparatus design for more comprehensive survey of interfacial electric properties can be provided by optical SHG with corona charging. Corona charging is a non-contact bias control that can modulate surface potential by depositing charged particles for characterization via a Kelvin probe. Integration of corona charging enables tunable biasing control for interfacial electrical characterization by SHG. Optical second harmonic generation (SHG) provides excellent non-contact detection of interface electric properties (such as Dit, charge traps, doping . . . ). Such SHG techniques can be augmented with flexible biasing control, which can extend detection beyond static interfacial charging states. External electric bias can be applied in a non-destructive manner using corona discharge. A more comprehensive characterization of interfacial electric properties can thus be provided by modulation of surface band bending through the increased (e.g., entire) band gap states. This approach can thus extend the detection capability of conventional SHG technique in interface electric property characterization at variable band bending states. Non-contact nature of corona charging and SHG can be particularly beneficial for interface characterization as an in-line monitor in a semiconductor fabrication/production line.

Four-Wave and Multi-Wave Mixing

In various implementations of metrology systems employing corona charging, optical signals that are generated by other non-linear optical processes such as four-wave mixing and multi-wave mixing can be used to determine various characteristics (e.g., electrical properties of an interfacial region) of a semiconductor device. Four-wave mixing and multi-wave mixing are non-linear optical phenomena in which two or more incident beams at same or different optical frequencies interact with each other as a result of higher order non-linear susceptibilities of a non-linear medium to generate optical signals having an optical frequency or optical frequencies different than the two or more incident beams.

Four-wave mixing, for example, is a non-linear optical phenomenon in which a first incident optical beam having an optical frequency $f_1$ and a second incident optical beam having an optical frequency $f_2$ greater than $f_1$ interact with each other as a result of a third order non-linear susceptibility ($\chi^{(3)}$) of a non-linear optical medium to generate four-wave mixing signal components. The four-wave mixing signal components can include a third beam having an optical frequency $f_3=f_1-(f_2-f_1)$ and a fourth beam having an optical frequency $f_4=f_2+(f_2-f_1)$. The optical frequency of the third beam $f_3$ is a difference between the optical frequency $f_2$ of the second beam from twice the optical frequency $f_1$ of the first beam. The optical frequency of the fourth beam $f_4$ is a difference between the optical frequency $f_1$ of the first beam from twice the optical frequency $f_2$ of the second beam. Various optical properties of the four-wave mixing signal components can be measured to determine characteristics of an interfacial region of a semiconductor device. The optical properties of the four-wave mixing signal components can include spectral and/or temporal characteristics of the intensity, frequency and/or phase.

Without relying on any particular theory, the third beam and the fourth beam of the four-wave mixing signal components can be generated as a result of a third order non-linear susceptibility $\chi^{(3)}$ of the non-linear medium. Additional optical beams can be potentially generated as a result of higher order non-linear susceptibilities, such as, for example $\chi^{(5)}$, $\chi^{(7)}$, etc., of the non-linear medium. Optical properties of the additional optical beams that are generated can also be measured to determine characteristics of an interfacial region of a semiconductor device.

Figure 7A:
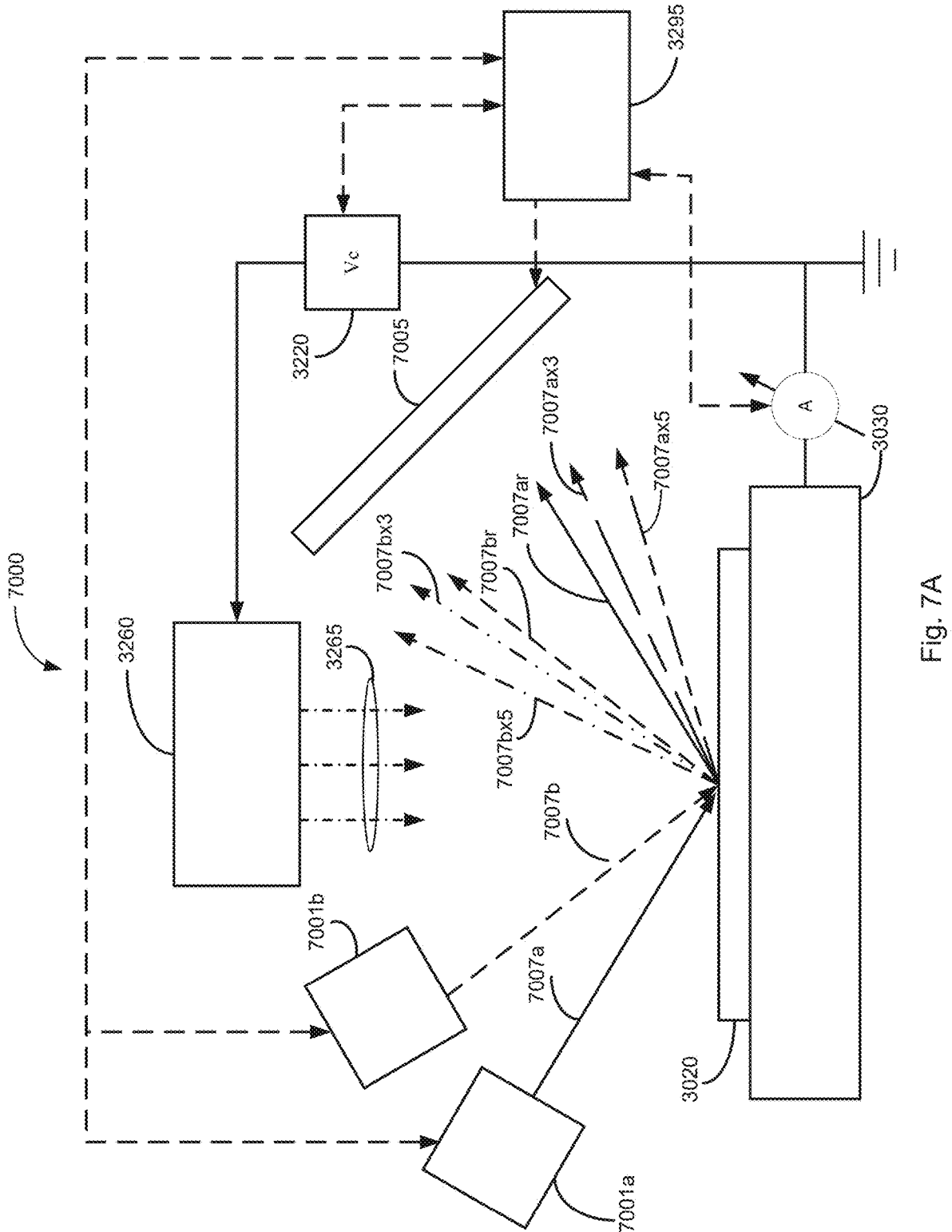
FIG. 7A schematically illustrates a side-view of an implementation of a metrology system configured to measure four-wave or multi-wave mixing signals in the presence of charges deposited by a corona discharge source.

FIG. 7A illustrates an implementation of an optical metrology system 7000 employing corona charging that is configured to obtain optical properties of optical beams generated as a result of third order and/or higher order non-linear susceptibilities of the non-linear medium. The system 7000 comprises two optical sources 7001a and 7001b configured to output beams of light 7007a and 7007b respectively that are incident on the sample 3020 supported by the chuck 3030. As discussed above, the chuck 3030 can hold the sample 3020 by vacuum or other mechanical methods. The sample 3020 can comprise a semiconductor wafer comprising an interfacial region. The interfacial region, for example, can comprise a semiconductor and an oxide junction, a metal and an oxide junction, a semiconductor and a metal junction or a junction between two semiconductors having different material composition and/or doping profile.

The system 7000 further comprises a detection system 7005 configured to receive the various optical beams generated as a result of third order and higher order non-linear susceptibilities of the non-linear medium. The optical characteristics of the various optical beams generated as a result of third order and higher order non-linear susceptibilities of the non-linear medium can vary as the surface band bending of the sample 3020 is modified as a result of charges deposited by corona discharge 3265 from the source 3260. In various implementations, the charges deposited by corona discharge 3265 from the source 3260 can modify the band bending or the various electron energy levels in the interfacial region of the sample 3020.

In various implementations, one of the optical sources 7001a and 7001b can comprise a flash lamp or a continuous wave (CW) laser source. In various implementations, one or both of the optical sources 7001a and 7001b can comprise a pulsed source (e.g., a pulsed laser source). For example, the one or both of the optical sources 7001a and 7001b can be configured to output pulses with a duration between about 1 microsecond and about 1 millisecond, between about 1 nanosecond and about 1 microsecond, between about 1 picosecond and about 1 nanosecond, between about 1 femtosecond and about 1 picosecond, and/or between about 1 femtosecond and about 1 attosecond or any range between any of these values. In those implementations of the system 7000 in which both the optical sources 7001a and 7001b comprise a pulsed source, a system configured to introduce a time delay ($\tau$) between the pulses output from the optical sources 7001a and 7001b can be provided. The time delay ($\tau$) between the pulses output from the optical sources 7001a and 7001b can be less than the time period of the pulse train output from one or both the optical sources 7001a and 7001b. In some implementations, the four-wave mixing signal can be measured with respect to the time delay to obtain information regarding the sample.

The delay system provided to introduce the time delay ($\tau$) between the pulses output from the optical sources 7001a and 7001b can comprise an electronic system integrated with one or both the optical sources 7001a and 7001b that introduces a time offset in the electrical signals driving one or both the optical sources 7001a and 7001b, a mechanical system (e.g., a mechanical shutter, a flywheel chopper, etc.) that attenuates (e.g., blocks) one or more pulses output from one or both the optical sources 7001a and 7001b, an electro-optic device, such as, for example a Pockel's cell or Kerr cell that attenuates (e.g. blocks) one or more pulses output from one or both the optical sources 7001a and 7001b, an optical delay line (e.g., a fiber-optic delay line, a integrated optical delay, or a free-space delay line comprising reflective optics) placed in the optical path between one or both of the optical sources 7001a and 7001b and the sample 3020 that introduces a time delay between (τ) between the pulses output from the optical sources 7001a and 7001b. In various implementations, the delay system can be configured to provide a variable time delay (τ) between the pulses output from the optical sources 7001a and 7001b.

The optical sources 7001a and 7001b can be configured to output light having an identical wavelength (λ) or optical frequency (ω) in some implementations. The four-wave/multi-wave mixing signals generated by incident light having the same wavelength (λ) or optical frequency (ω) is referred to as degenerate four-wave/multi-wave mixing signals. In some other implementations, the optical sources 7001a and 7001b can be configured to output light having different wavelengths ($λ_a$ and $λ_b$) or optical frequency ($ω_a$ and $ω_b$). The four-wave/multi-wave mixing signals generated by incident light having different wavelengths or optical frequency is referred to as non-degenerate four-wave/multi-wave mixing signals. In some implementations, the optical sources 7001a and 7001b can be configured to change or tune the wavelength or optical frequency of the output light.

Figure 7B:
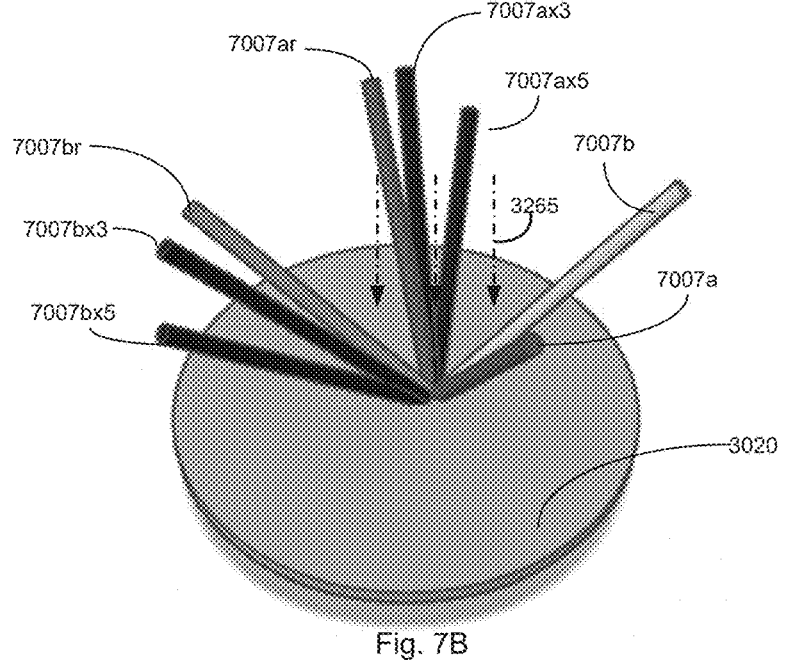
FIG. 7B schematically illustrates a top perspective view of an implementation of a metrology system configured to measure four-wave or multi-wave mixing signals.

The optical sources 7001a and 7001b can be oriented such that the optical beams 7007a and 7007b are incident obliquely on a region of the sample 3020 being investigated as shown in the schematic top perspective view shown in FIG. 7B. The optical beams 7007a and 7007b can be incident at different incident angles with respect to the normal to the surface of the sample 3020, in some implementations. In some implementations, the optical beams 7007a and 7007b can be incident at the same incident angle with respect to the normal to the surface of the sample 3020 but at different azimuthal angles as shown in FIG. 7B. In some implementations, the optical beams 7007a and 7007b can be incident at different incident angles with respect to the normal to the surface of the sample 3020 as well as different azimuthal angles. The spot sizes of the optical beams 7007a and 7007b can be configured such that the optical beams 7007a and 7007b at least partially overlap at the region of the sample 3020 being investigated.

Figure 7C:
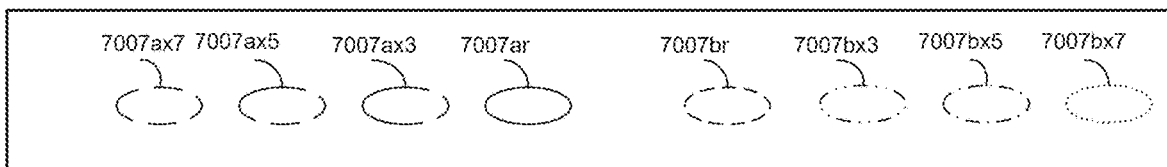
FIG. 7C illustrates a detection plane showing cross-sections of the different signals output from the surface of a sample being investigated.

The incident optical beams 7007a and 7007b can be specularly reflected from the surface of the sample 3020 as reflected optical beams 7007ar and 7007br. Four-wave mixing signal components 7007ax3 and 7007bx3 can be detected on either sides of the specularly reflected beams 7007ar and 7007br. The direction of the four-wave mixing signal components can depend on the direction of the wave vector ($\vec{k}$) of the reflected beams 7007ar and 7007br. For example, the direction of one of the four-wave mixing signal component 7007ax3 can be along a direction $2\vec{k}_a - \vec{k}_b$ where $\vec{k}_a$ and $\vec{k}_b$ are the wave vectors associated with the reflected beams 7007ar and 7007br. The direction of another four-wave mixing signal component 7007bx3 can be along a direction $2\vec{k}_b - \vec{k}_a$. The four-wave mixing signal components can be received and detected by photo-electric detectors disposed to in a direction along the direction of the four-wave mixing signal components 7007ax3 and 7007bx3. In some cases, additional optical signals 7007ax5 and 7007bx5 generated by higher order nonlinear susceptibilities can also be detected on either sides of the reflected beams 7007ar and 7007br, respectively. The cross-sections of the reflected beams 7007ar and 7007br, the four-wave mixing signal components 7007ax3 and 7007bx3 and higher order four wave or multi-wave mixing components 7007ax5, 7007bx5, 7007ax7, and 7007bx7 in a detection plane of the detecting system 7005 are shown in FIG. 7C.

As discussed above, surface band bending of the sample 3020 is modified as a result of charges deposited on the sample 3020 by the corona discharge 3265. In various implementations, the amount of charges deposited on the sample 3020 can be determined, as discussed above with reference to FIG. 6C, by measuring the current induced by the charges deposited on the surface of the sample 3020 using an electrical meter 3225 (e.g., an electrometer or an ammeter) disposed between the sample 3020 and an electrical ground as shown in FIGS. 6C and 7A. As discussed above with reference to FIG. 6C, the electronic processor 3295 can be configured to execute programmable instructions to determine the amount of charge deposited on the surface of the sample 3020 by the corona discharge from the corona discharge source 3260 based on an output provided by the electrical meter 3225 that is dependent upon the current between the sample 3020 and the electrical ground. In various implementations, the electronic processor 3295 can be further configured to control the voltage output from the voltage supply 3220. For example, the electronic processor 3295 can be configured to turn-off or change (e.g., decrease or increase) the voltage output from the voltage supply 3220 to the corona discharge source 3260. Changing the voltage output from the voltage supply 3220 to the corona discharge source 3260 can change the amount of charge that is deposited on the surface of the sample 3020 by the corona discharge 3265 from the corona discharge source 3260. In some implementations, the electronic processor 3295 can be configured to repeatedly turn-on/turn-off the voltage supply to the corona discharge source 3260. The four wave mixing signal or multi-wave mixing signal can be detected and/or measured for different amounts of charges deposited on the surface of the sample 3020. The amount of charges deposited on the surface of the sample 3020 can be correlated with different band-bending states. The four-wave mixing signal or multi-wave mixing signal may thus be detected and/or measured for different band-bending states. Time resolved four-wave mixing and multi-wave mixing signals can also be obtained for different amounts of time delay (τ) between the pulses output from the optical sources 7001a and 7001b and different amounts of charges deposited on the surface which is indicative of the different band-bending states. The obtained time resolved four-wave mixing and multi-wave mixing signals can be analyzed to obtain information related to charge dynamics in the region of the sample 3020. In various implementations, the sample 3020 can be repositioned to detect four-wave mixing and/or multi-wave mixing signals from another region of the sample 3020. Non-contact nature of corona charging and four-wave mixing/multi-wave mixing can be particularly beneficial for interface characterization as an in-line monitor in a semiconductor fabrication/production line.

Variations

Example invention embodiments, together with details regarding a selection of features have been set forth above. As for other details, these may be appreciated in connection with the above-referenced patents and publications as well as is generally known or appreciated by those with skill in the art. The same may hold true with respect to method-based aspects of the invention in terms of additional acts as commonly or logically employed. Regarding such methods, including methods of manufacture and use, these may be carried out in any order of the events which is logically possible, as well as any recited order of events. Furthermore, where a range of values is provided, it is understood that every intervening value, between the upper and lower limit of that range and any other stated or intervening value in the stated range is encompassed within the invention. Also, it is contemplated that any optional feature of the inventive variations described may be set forth and claimed independently, or in combination with any one or more of the features described herein.

Though the invention embodiments have been described in reference to several examples, optionally incorporating various features, they are not to be limited to that which is described or indicated as contemplated with respect to each such variation. Changes may be made to any such invention embodiment described and equivalents (whether recited herein or not included for the sake of some brevity) may be substituted without departing from the true spirit and scope hereof.

The various illustrative processes described may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, DisplayPort, or any other form. Accordingly, processes may be performed by processing electronics, control electronics, processing/control electronics or electronics.

A processor, processing electronics or electronics may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor (e.g., processing electronics, control electronics, processing/control electronics or electronics), or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more example embodiments, the functions described may be implemented in hardware, software, firmware, or any combination thereof. If implemented in software, the functions may be stored on, transmitted over or resulting analysis/calculation data output as one or more instructions, code or other information on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. The memory storage can also be rotating magnetic hard disk drives, optical disk drives, or flash memory based storage drives or other such solid state, magnetic, or optical storage devices.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventors hereof intend that only those claims which use the words "means for" are to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

It is also noted that all features, elements, components, functions, acts and steps described with respect to any embodiment provided herein are intended to be freely combinable and substitutable with those from any other embodiment. If a certain feature, element, component, function, or step is described with respect to only one embodiment, then
it should be understood that that feature, element, compo-
nent, function, or step can be used with every other embodi-
ment described herein unless explicitly stated otherwise.
This paragraph therefore serves as antecedent basis and
written support for the introduction of claims, at any time,
that combine features, elements, components, functions, and
acts or steps from different embodiments, or that substitute
features, elements, components, functions, and acts or steps
from one embodiment with those of another, even if the
following description does not explicitly state, in a particular
instance, that such combinations or substitutions are pos-
sible. It is explicitly acknowledged that express recitation of
every possible combination and substitution is overly bur-
densome, especially given that the permissibility of each and
every such combination and substitution will be readily
recognized by those of ordinary skill in the art.

In some instances entities are described herein as being
coupled to other entities. It should be understood that the
terms "interfit", "coupled" or "connected" (or any of these
forms) may be used interchangeably herein and are generic
to the direct coupling of two entities (without any non-
negligible, e.g., parasitic, intervening entities) and the indi-
rect coupling of two entities (with one or more non-negli-
gible intervening entities). Where entities are shown as
being directly coupled together, or described as coupled
together without description of any intervening entity, it
should be understood that those entities can be indirectly
coupled together as well unless the context clearly dictates
otherwise.

Reference to a singular item includes the possibility that
there are a plurality of the same items present. More
specifically, as used herein and in the appended claims, the
singular forms "a," "an," "said," and "the" include plural
referents unless specifically stated otherwise. In other words,
use of the articles allow for "at least one" of the subject item
in the description above as well as the claims below.

It is further noted that the claims may be drafted to
exclude any optional element (e.g., elements designated as
such by description herein a "typical," that "can" or "may"
be used, etc.). Accordingly, this statement is intended to
serve as antecedent basis for use of such exclusive termi-
nology as "solely," "only" and the like in connection with
the recitation of claim elements, or other use of a "negative"
claim limitation language. Without the use of such exclusive
terminology, the term "comprising" in the claims shall allow
for the inclusion of any additional element—irrespective of
whether a given number of elements are enumerated in the
claim, or the addition of a feature could be regarded as
transforming the nature of an element set forth in the claims.
Yet, it is contemplated that any such "comprising" term in
the claims may be amended to exclusive-type "consisting"
language. Also, except as specifically defined herein, all
technical and scientific terms used herein are to be given as
broad a commonly understood meaning to those skilled in
the art as possible while maintaining claim validity.

While the embodiments are susceptible to various modi-
fications and alternative forms, specific examples thereof
have been shown in the drawings and are herein described
in detail. It should be understood, however, that these
embodiments are not to be limited to the particular form
disclosed, but to the contrary, these embodiments are to
cover all modifications, equivalents, and alternatives falling
within the spirit of the disclosure. Furthermore, any features,
functions, acts, steps, or elements of the embodiments may
be recited in or added to the claims, as well as negative
limitations (as referenced above, or otherwise) that define the inventive scope of the claims by features, functions,
steps, or elements that are not within that scope. Thus, the
breadth of the inventive variations or invention embodi-
ments are not to be limited to the examples provided, but
only by the scope of the following claim language. That
being said, we claim:

What is claimed:

1. A method of optical interrogation of a sample having a
top side and a bottom side, the method comprising:
applying optical radiation from a optical source to a
surface of the sample;
depositing electrical charge on the top side of the sample
using a corona gun;
measuring an electrical current between the bottom side
of the sample and an electrical ground using an amme-
ter to determine an amount of the electrical charge
deposited, said measured electrical current induced by
the electrical charge deposited on the top side of the
sample;
determining the amount of electrical charge deposited on
the top side of the sample based on the measured
electrical current;
detecting using an optical detector, a variation in Second
Harmonic Generation (SHG) effect signals generated
by the optical radiation for different amounts of elec-
trical charge deposited on the top side of the sample;
and
determining a characteristic of the variation of the
detected SHG effect signals in the presence of the
optical radiation and the determined amount of electri-
cal charge deposited on the top side of the sample.

2. The method of claim 1, used to determine interfacial
charging states at corresponding band bending of the sample
as a function of surface charge.

3. The method of claim 1, used to determine carrier
dynamics at corresponding band bending of the sample as a
function of surface charge.

4. The method of claim 1, wherein the bottom side of the
sample is in contact with a conductive chuck and the
ammeter is electrically connected between the conductive
chuck and the electrical ground.

5. The method of claim 1, further comprising controlling
a voltage provided to the corona gun based on the deter-
mined amount of electrical charge deposited on the top side
of the sample.

6. A system for optically interrogating a surface of a
sample having a top side and a bottom side accompanied by
application of electric charge to said top side of the sample,
said system comprising:
an optical source configured to emit optical radiation, said
optical source disposed so as to direct said optical
radiation onto said surface of said sample;
a corona discharge source disposed with respect to the
sample to provide different amounts of electric charge
on the top side of the sample;
an optical detector configured to detect a variation in
second harmonic generated light from the sample in the
presence of the optical radiation and the different
amounts of electrical charge;
a conductive chuck configured to support the sample and
be in contact with the bottom side of the sample;
an ammeter connected between an electrical ground and
said conductive chuck; and
electronics configured to:
determine an amount of electrical charge deposited on
the top side of the sample based on an electrical
current between the bottom side of the conductive chuck and the electrical ground measured using the ammeter, said electrical current induced by the electrical charge deposited on the top side of the sample.

7. The system of claim 6, wherein said optical source comprises a laser.

8. The system of claim 6, wherein said ammeter is configured to measure an electrical current induced between the sample and electrical ground by the different amounts of electric charge provided to the sample.

9. The system of claim 8, wherein the electronics are configured to associate different amounts of SHG signal with the different amounts of electrical charge provided by the corona discharge source.

10. The system of claim 6, furhter comprising a pumping optical source configured to emit pumping optical radiation, said pumping optical source disposed so as to direct said pumping optical radiation onto said surface of said sample.

11. A system for optically interrogating a surface of a sample having a top side and a bottom side accompanied by application of electric charge to said sample, said system comprising:

a first optical source configured to emit a first incident beam of light towards said surface of said sample;

a second optical source configured to emit a second incident beam of light towards said surface of said sample, wherein the first incident beam overlaps with the second incident beam on the sample to generate at least one non-holographic four-wave mixing or multi-wave mixing signal component via a nonlinear optical interaction with the sample;

a corona discharge source disposed with respect to the sample to provide electric charge on the top side of the sample;

an optical detection system configured to receive the at least one non-holographic four-wave mixing or multi-wave mixing signal component and detect a variation in at least one non-holographic four-wave mixing signal component or at least one non-holographic multi-wave mixing signal component from a portion of the sample illuminated by the first and the second incident beams of light for different amounts of electrical charge deposited on said portion of the sample; and electronics electrically connected to said optical detection system to receive a signal based on said detected variation in at least one non-holographic four-wave mixing signal component or at least one non-holographic multi-wave mixing signal component.

12. The system of claim 11, wherein said electronics are configured to determine the different amounts of electrical charge provided by the corona discharge source.

13. The system of claim 11, wherein said electronics are configured to determine a characteristic of the at least one four-wave mixing signal component or the at least one multi-wave mixing signal component detected for the different amounts of the electrical charge deposited on the top side of the sample.

14. The system of claim 13, wherein the electronics are configured to obtain information related to properties of the sample based on the determined characteristic of the detected at least one four-wave mixing signal component or multi-wave mixing signal component for the different amounts of the electrical charge.

15. The system of claim 13, wherein the electronics is configured to obtain information related to charge dynamics of the sample based on the determined characteristic of the detected at least one four-wave mixing signal component or multi-wave mixing signal component for the different amounts of the electrical charge.

16. The system of claim 11, further comprising a conductive chuck configured to support the sample and be in contact with the bottom side of the sample and an ammeter connected between an electrical ground and said conductive chuck, said electronics configured to determine an amount of electrical charge deposited on the top side of the sample based on an electrical current between the bottom side of the conductive chuck and the electrical ground measured using the ammeter.

17. A method of optical interrogation of a sample having a top side and a bottom side, the method comprising:

directing a first incident beam from a first optical source towards a region on a surface of the sample;

directing a second incident beam from a second optical source towards the region on the surface of the sample, wherein the first incident beam overlaps with the second incident beam on the sample to generate at least one non-holographic four-wave mixing or multi-wave mixing signal component via a nonlinear optical interaction with the sample;

depositing electrical charge on the top side of the sample using a corona gun; and detecting using an optical detection system, a variation in at least one non-holographic four-wave mixing signal component or at least one non-holographic multi-wave mixing signal component from a portion of the top side of the sample generated by the first incident beam and the second incident beam for different amounts of the electrical charge deposited on said portion of the top side of the sample.

18. The method of claim 17, further comprising determining information related to the sample based on the detected at least one four-wave mixing signal component or at least one multi-wave mixing signal component.

19. The method of claim 17, further comprising determining information related to charge dynamics of the sample based on the detected at least one four-wave mixing signal component or at least one multi-wave mixing signal component.

20. The method of claim 17, further comprising determining a characteristic of the at least one four-wave mixing signal component or at least one multi-wave mixing signal component for the different amounts of electrical charge deposited on the top side of the sample.

21. The method of claim 20, further comprising determining information related to charge dynamics of the sample based on the determined characteristic of the detected at least one four-wave mixing signal component or at least one multi-wave mixing signal component for the different amounts of the electrical charge.

22. The method of claim 17, further comprising measuring an electrical current between the bottom side of the sample and an electrical ground using an ammeter and determining an amount of electrical charge deposited on the top side of the sample based on the measured electrical current.

* * * * *